United States Patent
Hintz et al.

(10) Patent No.: US 11,016,150 B2
(45) Date of Patent: May 25, 2021

(54) METHOD, APPARATUS AND SYSTEM FOR DETECTING STRAY MAGNETIC FIELD

(71) Applicant: HONEYWELL INTERNATIONAL INC., Morris Plains, NJ (US)

(72) Inventors: Fred Hintz, Freeport, IL (US); Jason Chilcote, Frisco, TX (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 87 days.

(21) Appl. No.: 16/429,524

(22) Filed: Jun. 3, 2019

(65) Prior Publication Data
US 2020/0379059 A1    Dec. 3, 2020

(51) Int. Cl.
*G01R 33/00* (2006.01)
*G01R 33/09* (2006.01)

(52) U.S. Cl.
CPC ......... *G01R 33/007* (2013.01); *G01R 33/096* (2013.01)

(58) Field of Classification Search
CPC ............................. G01R 33/007; G01R 33/096
USPC .................. 324/207.21, 207.13, 207.11, 200
See application file for complete search history.

(56) References Cited

U.S. PATENT DOCUMENTS

| | | | | |
|---|---|---|---|---|
| 5,430,373 A * | 7/1995 | Ichikawa | ............... | G01D 5/145 324/207.21 |
| 6,400,143 B1 * | 6/2002 | Travostino | ............. | G01D 5/145 324/174 |
| 2009/0267594 A1 | 10/2009 | Kather | | |
| 2011/0156700 A1 | 6/2011 | Kariv | | |
| 2011/0291646 A1 * | 12/2011 | Musha | ................. | G01D 5/2457 324/207.11 |
| 2012/0153942 A1 | 6/2012 | van Veldhoven et al. | | |
| 2013/0238278 A1 * | 9/2013 | Shoemaker | ............ | G01D 5/145 702/145 |
| 2015/0042320 A1 * | 2/2015 | Cadugan | .............. | G01R 33/075 324/207.2 |
| 2016/0123771 A1 * | 5/2016 | David | .................. | G01D 5/2013 324/207.2 |
| 2018/0087889 A1 | 3/2018 | Ausserlechner et al. | | |

OTHER PUBLICATIONS

Extended European Search Report issued in European Application No. 20177273.8, dated Oct. 21, 2020, 9 pages.

\* cited by examiner

*Primary Examiner* — Giovanni Astacio-Oquendo
(74) *Attorney, Agent, or Firm* — Alston & Bird LLP

(57) ABSTRACT

Methods, apparatuses, and systems for detecting a stray magnetic field are provided. An example apparatus may include a first magnetic sensor element at a first position relative to a magnetic field source to detect a target magnetic field emitted by the magnetic field source, a second magnetic sensor element at a second position relative to the magnetic field source to detect the target magnetic field emitted by the magnetic field source, and a processor element electronically coupled to the first magnetic sensor element and the second magnetic sensor element. In some examples, the processor element may be configured to: receive a first output from the first magnetic sensor element, receive a second output from the second magnetic sensor element, and detect the stray magnetic field interfering with the target magnetic field based at least in part on the first output and the second output.

14 Claims, 15 Drawing Sheets

METHOD, APPARATUS AND SYSTEM FOR DETECTING STRAY MAGNETIC FIELD

FIELD OF THE INVENTION

The present disclosure relates generally to methods, apparatuses, and systems associated with providing magnetic field sensing, and more particularly, to methods, apparatuses, and systems for detecting stray magnetic field interference.

BACKGROUND

A magnetic field may be produced by a magnetic particle or object (such as a magnet), and/or an electric current. For example, a current-carrying wire (such as a power transmission line) may produce a magnetic field around the wire. Certain sensor configurations may create one or more magnetic fields, and/or may monitor one or more magnetic fields to detect and/or measure one or more desired physical and/or electrical parameters.

However, existing devices and systems do not overcome many technical challenges and difficulties associated with magnetic field sensing. For example, magnetic sensors may be exposed to both a target magnetic field and one or more stray magnetic fields operating as sources of magnetic field interference. A "target magnetic field" is a magnetic field desired to be monitored by a sensor. For example, a target magnetic field may be generated by a magnet within a device. A "stray magnetic field" is a magnetic field causing interference with the target magnetic field and may be detected by a sensor. For example, a stray magnetic field may be created by a magnet or power transmission line that is external to, but near, a device incorporating the sensor.

Existing devices fail to distinguish the stray magnetic fields from the target magnetic field. Thus, a need exists for systems and methods for distinguishing between target magnetic fields and stray magnetic fields.

BRIEF SUMMARY

Various embodiments described herein relate to methods, apparatuses, and systems for providing magnetic field sensing. In particular, various embodiments are related to detecting stray magnetic field.

In accordance with various embodiments of the present disclosure, an example apparatus is provided. The example apparatus may comprise a first magnetic sensor element, a second magnetic sensor element, and a processor element electronically coupled to the first magnetic sensor element and the second magnetic sensor element. In some examples, the first magnetic sensor element may be at a first position relative to a magnetic field source to detect a target magnetic field emitted by the magnetic field source. In some examples, the second magnetic sensor element may be at a second position relative to the magnetic field source to detect the target magnetic field emitted by the magnetic field source. In some examples, the processor element may be configured to: receive a first output from the first magnetic sensor element, receive a second output from the second magnetic sensor element, and detect the stray magnetic field interfering with the target magnetic field by: calculating an output deviation between the first output and the second output; and determining whether the output deviation satisfies a deviation criteria.

In some examples, the first magnetic sensor element may comprise a first anisotropic magnetoresistive sensing member. In some examples, the second magnetic sensor element may comprise a second anisotropic magnetoresistive sensing member.

In some examples, the magnetic field source may comprise a magnetic element. In some examples, the magnetic element may be a ring magnet comprising at least a first pole and a second pole.

In some examples, the first magnetic sensor element, the second magnetic sensor element, and the processor element may be contained in the same integrated circuit.

In some examples, in response to detecting the stray magnetic field, the processor element is further configured to disable position outputs associated with the apparatus.

In some examples, the first magnetic sensor element may be aligned with a first radius of the magnetic element, and the second magnetic sensor element may be aligned with a second radius of the magnetic element. In some examples, the first radius may be positioned forty-five degrees apart from the second radius.

In some examples, the first magnetic sensor element and the second magnetic sensor element may be integrated in a first magnetic sensor package. In some examples, when detecting the stray magnetic field, the processor element may be configured to further: determine a phase separation based at least in part on the first position associated with the first magnetic sensor element and the second position associated with the second magnetic sensor element, calculate an output deviation between the first output and the second output, and determine whether the output deviation satisfies a deviation criterion, wherein the deviation criterion may be based at least in part on the phase separation.

In some examples, the example apparatus may further comprise a third magnetic sensor element integrated in the first magnetic sensor package. In some examples, the processor element may be configured to further receive a third output from the third magnetic sensor element. In some examples, detecting the stray magnetic field may be further based on the third output. In some examples, the first magnetic sensor element, the second magnetic sensor element, the third magnetic sensor element, and the processor element are contained in the same integrated circuit.

In accordance with various embodiments of the present disclosure, an example method for detecting a stray magnetic field is provided. The example method may comprise receiving a first output from a first magnetic sensor element, receiving a second output from a second magnetic sensor element, calculating an output deviation between the first output and the second output; and detecting the stray magnetic field interfering with the target magnetic field by determining whether the output deviation satisfies a deviation criteria. In some examples, the first magnetic sensor element may be at a first position relative to a magnetic field source to detect a target magnetic field emitted by the magnetic field source. In some examples, the second magnetic sensor element may be at a second position relative to the magnetic field source to detect the target magnetic field emitted by the magnetic field source.

In accordance with various embodiments of the present disclosure, an example computer program product is provided. The example computer program product comprises at least one non-transitory computer-readable storage medium having computer-readable program code portions stored therein, the computer-readable program code portions comprising an executable portion configured to: receive a first output from a first magnetic sensor element, receive a second output from a second magnetic sensor element, and detect the stray magnetic field interfering with the target magnetic field based at least in part on the first output and the second output. In some examples, the first magnetic sensor element may be at a first position relative to a magnetic field source to detect a target magnetic field emitted by the magnetic field source. In some examples, the second magnetic sensor element may be at a second position relative to the magnetic field source to detect the target magnetic field emitted by the magnetic field source.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Figure 1:
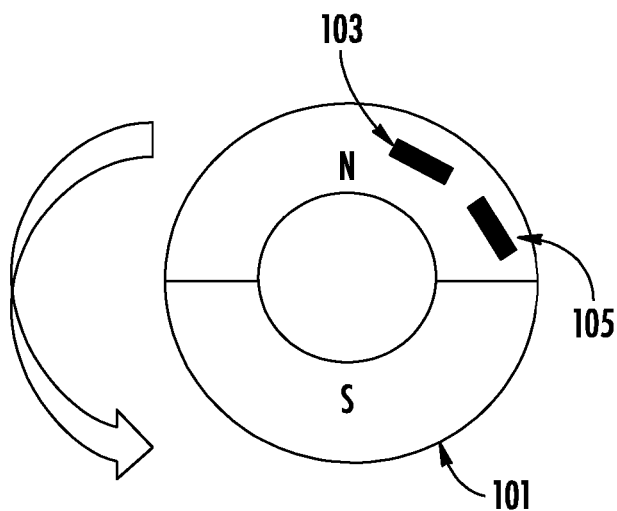
FIG. 1 illustrates a schematic diagram of an example apparatus in accordance with various embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

The phrases "in one embodiment," "according to one embodiment," "in some examples," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that specific component or feature is not required to be included or to have the characteristic. Such component or feature may be optionally included in some embodiments, or it may be excluded.

The term "electronically coupled" in the present disclosure refers to two or more components (for example but not limited to, magnetic sensor element(s), processor element(s), speaker element(s), light-emitting diode (LED) element(s), vibrator element(s)) and/or electric circuit(s) being connected through wired means (for example but not limited to, conductive wires or traces) and/or wireless means (for example but not limited to, electromagnetic field), such that data and/or information may be transmitted to and/or received from the components that are electronically coupled.

In some examples, a position sensor may include a magnet, and may measure absolute positions or relative displacements based on the detected properties of the magnetic field. In some examples, a power tool (such as, but not limited to, a drill) may incorporate magnetic sensing solutions for turning on/off the tool and adjusting tool operations (such as, but not limited to, changing the motor speed of the drill).

As described above, existing devices and systems do not overcome many technical challenges and difficulties associated with magnetic field sensing, and are plagued by many limitations. In contrast, example methods, systems, and apparatuses in accordance with various embodiments of the present disclosure may be effective in detecting stray magnetic field(s) (that a device is exposed to) by, for example, disposing two or more magnetic sensor elements on or around a target magnetic field source (e.g., a magnet of the device). Based on the detected stray magnetic field(s), example methods, systems, and apparatuses in accordance with various embodiments of the present disclosure may further perform an applicable process (or prevent the occurrence of an applicable process). For example, various systems may prevent undesired actuation of the device due to the detected stray magnetic field.

Referring now to FIG. 1, an example apparatus in accordance with various embodiments of the present disclosure is shown. In the example embodiment as shown in FIG. 1, the example apparatus may comprise a first magnetic sensor element 103 and a second magnetic sensor element 105. In some examples, the example apparatus may further comprise a processor element that is electronically coupled to the first magnetic sensor element 103 and the second magnetic sensor element 105, example details of which are described and illustrated in at least FIG. 4 of the present disclosure.

The term "magnetic sensor element" in the present disclosure refers to an electronic component or device that may be configured to detect and/or measure magnetic field. In some examples, a magnetic sensor element may comprise, such as, but not limited to, an anisotropic magnetoresistive (AMR) sensing member. The AMR sensing member may comprise ferromagnetic material(s), such as, but not limited to, ferromagnetic alloys. In some examples, the electrical resistance of such material(s) may correlate to the angle between the direction of the electric current in such material(s) and the direction of the detected magnetic field. As such, the AMR sensing member may generate an output that indicates the detected magnetic field.

Figure 2:
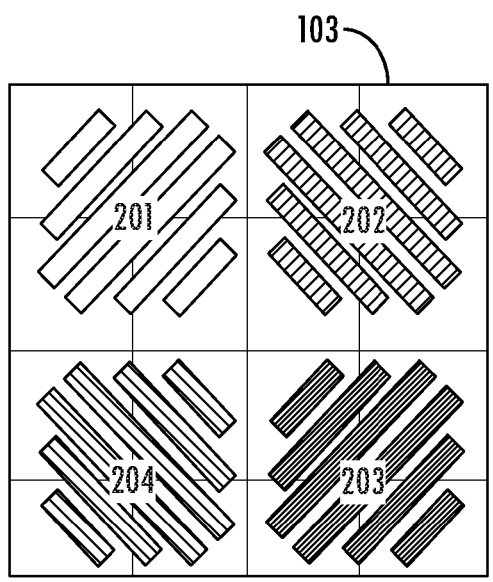
FIG. 2 illustrates a block diagram of an example apparatus in accordance with various embodiments of the present disclosure.

For example, FIG. 2 illustrates an example block diagram of the first magnetic sensor element 103. In the embodiment as shown in FIG. 2, the first magnetic sensor element 103 may comprise four (4) AMR sensing members, i.e. AMR sensing members 201, 202, 203, and 204, which may be disposed on, for example, a silicon die.

In some examples, each of the AMR sensing members 201, 202, 203, and 204 may comprise a plurality of connected AMR sensing bars. For example, the AMR sensing members 201 as shown in FIG. 2 may comprise six (6) parallel AMR sensing bars. In some examples, an AMR sensing member may comprise less than six or more than six AMR sensing bars, without deviating from the scope of the present disclosure.

In some examples, each of the AMR sensing bars in the same AMR sensing member may be connected (e.g., in series) with neighboring AMR sensing bars, and may carry the same electric current that travels in the same direction. As described above, the electrical resistance of AMR sensing bars may correlate to the angle between the direction of the electric current and the direction of the detected magnetic field. Because each AMR sensing bar within the same AMR sensing member is parallel to each other, a change of electrical resistance of the AMR sensing member may indicate a change in the detected magnetic field.

In some examples, one of the AMR sensing members 201, 202, 203, and 204 may be in a perpendicular arrangement with another AMR sensing member. For example, the AMR sensing member 201 may be in a perpendicular arrangement with the AMR sensing member 202 and/or with AMR sensing member 204. Additionally, or alternatively, the AMR sensing member 203 may be in a perpendicular arrangement with the AMR sensing member 204 and/or with AMR sensing member 202. In some examples, the perpendicular arrangements of these AMR sensing members may improve sensitivity and/or accuracy in detecting magnetic field.

In some examples, the AMR sensing members 201, 202, 203, and 204 may be connected through a bridge circuit, such as, but not limited to, a Wheatstone bridge. For example, two of the AMR sensing members may be connected on one arm of the Wheatstone bridge, and the other two may be connected on the other arm of the Wheatstone bridge.

Figure 3:
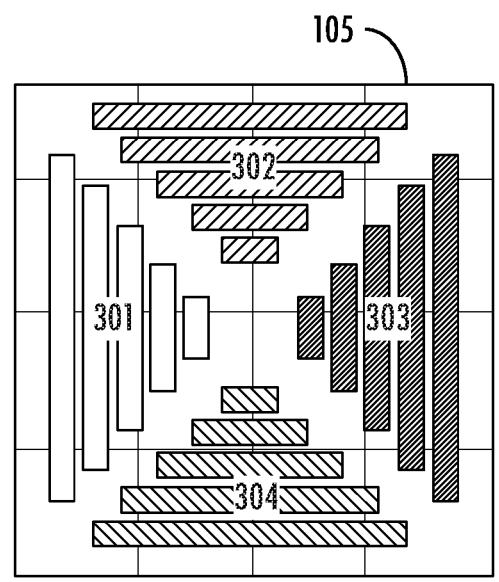
FIG. 3 illustrates a block diagram of an example apparatus in accordance with various embodiments of the present disclosure.

As another example, FIG. 3 illustrates an example block diagram of the second magnetic sensor element 105 as shown in FIG. 1. Similar to the first magnetic sensor element 103 as described in connection with FIG. 2, the second magnetic sensor element 105 as shown in FIG. 3 may comprise four (4) AMR sensing members, i.e. AMR sensing members 301, 302, 303, and 304, which may be disposed on, for example, a silicon die.

Additionally, or alternatively, similar to the AMR sensing members as described in connection with FIG. 2, each of the AMR sensing members 301, 302, 303, and 304 may comprise a plurality of connected AMR sensing bars. Additionally, or alternatively, the AMR sensing members 301, 302, 303, and 304 may be connected through a bridge circuit, such as, but not limited to, a Wheatstone bridge, similar to those described above in connection with FIG. 2.

While the example embodiment as illustrated in FIG. 2 shows that each of the AMR sensing bars is in a forty-five-degree (45°) arrangement with one of the edges of the first magnetic sensor element 103, and that the example embodiment as illustrated in FIG. 3 shows that each of the AMR sensing bars is at a perpendicular arrangement with one of the edges of the second magnetic sensor element 105, it is noted that the scope of the present disclosure includes the AMR sensing bars being arranged at other angle(s) with one of the edges of the magnetic sensor element.

Referring back to FIG. 1, in accordance with various examples of the present disclosure, each of the first magnetic sensor element 103 and the second magnetic sensor element 105 may be at a position relative to a magnetic field source to detect a target magnetic field emitted by the magnetic field source. For example, in the embodiment as shown in FIG. 1, the magnetic field source may comprise a magnetic element 101. In some examples, the first magnetic sensor element 103 may be at a first position relative to the magnetic field source (i.e. the magnetic element 101) to detect the target magnetic field emitted by the magnetic field source (i.e. the magnetic element 101). In some examples, the second magnetic sensor element 105 may be at a second position relative to the magnetic field source (i.e. the magnetic element 101) to detect the target magnetic field emitted by the magnetic field source (i.e. the magnetic element 101).

In some examples, the first magnetic sensor element 103 and the second magnetic sensor element 105 may be positioned on or around the magnetic element 101 so that, for example, the target magnetic field emitted by the magnetic element 101 may cause the same or similar effects on the electrical quantities of the first magnetic sensor element 103 and the second magnetic sensor element 105 (example details of which are described and illustrated in connection with at least FIG. 5).

In some examples, the first magnetic sensor element 103 may be in a forty-five-degree (45°) arrangement to the second magnetic sensor element 105, relative to the magnetic element 101, while enabling the magnetic element 101 to move (e.g., rotate relative to the first magnetic sensor element 103 and the second magnetic sensor element 105. For example, a centerline of the first magnetic sensor element 103 may be aligned with a first radius extending away from a center axis of the magnetic element 101, and a centerline of the second magnetic sensor element 105 may be aligned with a second radius extending away from a center axis of the magnetic element 101. The first radius may be positioned forty-five degrees apart from the second radius. Because of their different orientations, the first magnetic sensor element 103 and the second magnetic sensor element 105 may be affected differently by a stray magnetic field (example details of which are described and illustrated in connection with at least FIG. 6 and FIG. 7), thereby enabling detection of the stray magnetic field by detecting differences in the outputs generated by the first magnetic sensor 103 and second magnetic sensor 105, respectively.

Additionally, or alternatively, the first magnetic sensor element 103 and/or the second magnetic sensor element 105 may be positioned around the magnetic element 101 and spaced apart from the magnetic element 101. In some examples, the first magnetic sensor element 103 and/or the second magnetic sensor element 105 may be secured at a position relative to the center of the magnetic element 101. For example, an example apparatus may comprise a cover member that houses the magnetic element 101, the first magnetic sensor element 103, and the second magnetic sensor element 105. In such an example, the first magnetic sensor element 103 and/or the second magnetic sensor element 105 may be secured on an inner surface of the cover member.

Additionally, or alternatively, the first magnetic sensor element 103 and/or the second magnetic sensor element 105 may be positioned on the rotation axis of the magnetic element 101.

Additionally, or alternatively, the first magnetic sensor element 103 and the second magnetic sensor element 105 may be arranged in other orientations, without deviating from the scope of the present disclosure.

In the embodiment as shown in FIG. 1, the magnetic element 101 may be a two-pole ring magnet that comprises at least a first pole and a second pole. Additionally, or alternatively, a magnetic sensor element of the present disclosure may be in other suitable form(s) such as, but not limited to, a multipole ring magnet having greater than two poles, example details of which are illustrated and described at least in connection with FIG. 20 and FIG. 25.

The embodiment as illustrated in FIG. 1 shows two magnetic sensor elements, i.e. the first magnetic sensor element 103 and the second magnetic sensor element 105. It is noted that the scope of the present disclosure is not limited to only two magnetic sensor elements, and example apparatuses of the present disclosure may include more than two magnetic sensor elements.

Figure 4:
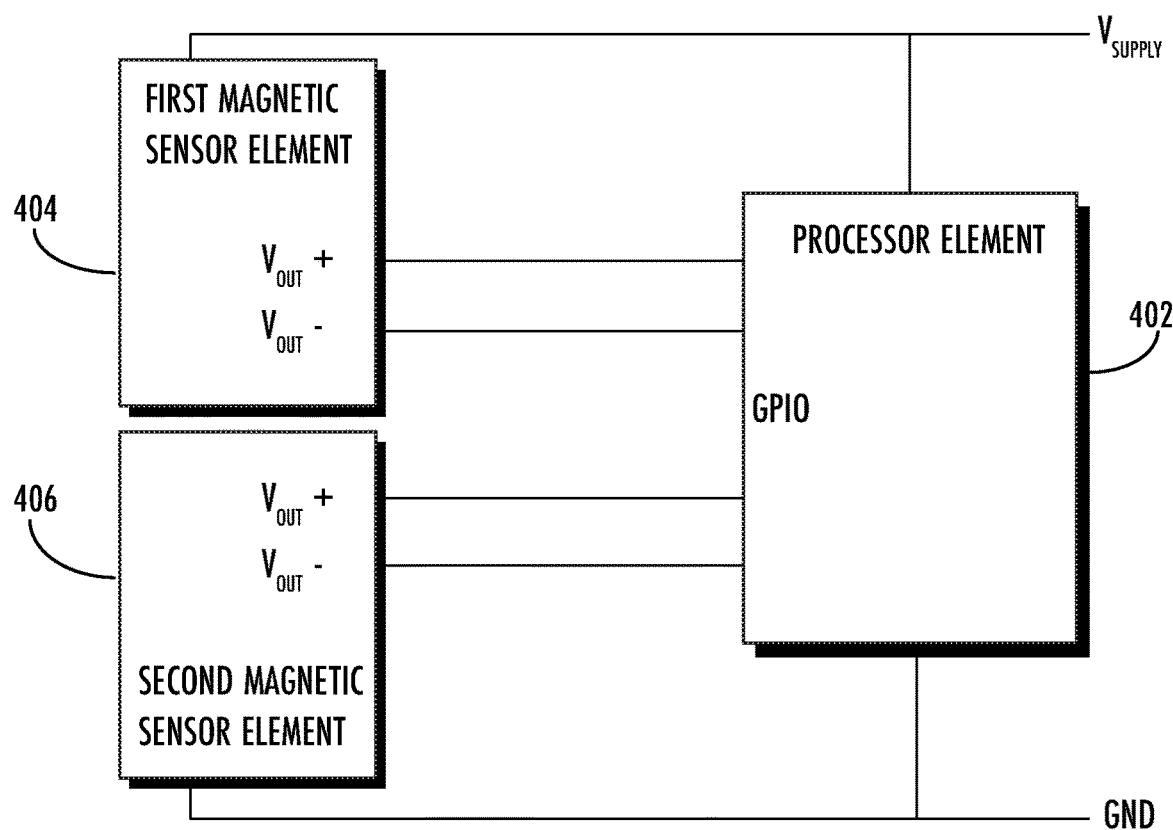
FIG. 4 illustrates a circuit diagram of an example apparatus in accordance with various embodiments of the present disclosure.

Referring now to FIG. 4, an example circuit diagram illustrating various electronic elements of an example apparatus in accordance with the present disclosure is shown. For example, the example apparatus may comprise a processor element 402 that is electronically coupled to the first magnetic sensor element 404 and the second magnetic sensor element 406. The electronic elements may be powered by a voltage source $V_{SUPPLY}$.

In some examples, the first magnetic sensor element, the second magnetic sensor element, and the processor element may be contained in the same integrated circuit. For example, in the example embodiment as shown in FIG. 4, the first magnetic sensor element 404, the second magnetic sensor element 406, and the processor element 402 may be contained in the same integrated circuit.

In some examples, the processor element 402 may be in the form of, for example but not limited to, an application-specific integrated circuit (ASIC) or a central processing unit (CPU). In some examples, the processor element 402 may be in other suitable form(s) without deviating from the scope of the present disclosure.

In some examples, the first magnetic sensor element 404 may be similar to the first magnetic sensor element 103 described above in connection with FIG. 1 and FIG. 2. In some examples, the second magnetic sensor element 406 may be similar to the second magnetic sensor element 105 described above in connection with FIG. 1 and FIG. 3.

Further, as shown in FIG. 4, the first magnetic sensor element 404 may generate and transmit a first output to the processor element 402, and the second magnetic sensor element 406 may generate and transmit a second output to the processor element 402. The first output and the second output may be indicative of one or more properties of the detected magnetic field. Examples of first output and second output are described and illustrated in at least FIG. 5, FIG. 6, and FIG. 7 of the present disclosure.

While the embodiment as illustrated in FIG. 4 shows that the first magnetic sensor element 404 and the second magnetic sensor element 406 may generate differential outputs (i.e. $V_{OUT}+$ and $V_{OUT}-$), it is noted that the scope of the present disclosure is not limited to differential outputs. For example, the first magnetic sensor element 404 and/or the second magnetic sensor element 406 may generate a single-ended output.

Referring back to FIG. 4, the processor element 402 may receive the first output from the first magnetic sensor element 404 and the second output from the second magnetic sensor element 406 through one or more General Purpose Input/output (GPIO) pins. The processor element 402 may determine whether there is a stray magnetic field based at least in part on the first output and the second output, example details of which are described and illustrated at least in connection with FIG. 8 below.

In some examples, an example apparatus in accordance with the present disclosure may optionally comprise one or more additional electronic elements, including, for example, speaker element(s), light-emitting diode (LED) element(s), and/or vibrator element(s). In some examples, the processor element 402 may be electronically coupled to the speaker element(s), light-emitting diode (LED) element(s), and/or vibrator element(s).

In some examples, the speaker element(s) may be configured to output audio alerts (for example, an alarm sound and/or a pre-recorded audio message). In some examples, the light-emitting diode (LED) element(s) may be configured to output a visual alert (for example, a flashing light and/or a red light). In some examples, the vibrator element(s) may be configured to output a vibration.

Figure 5:
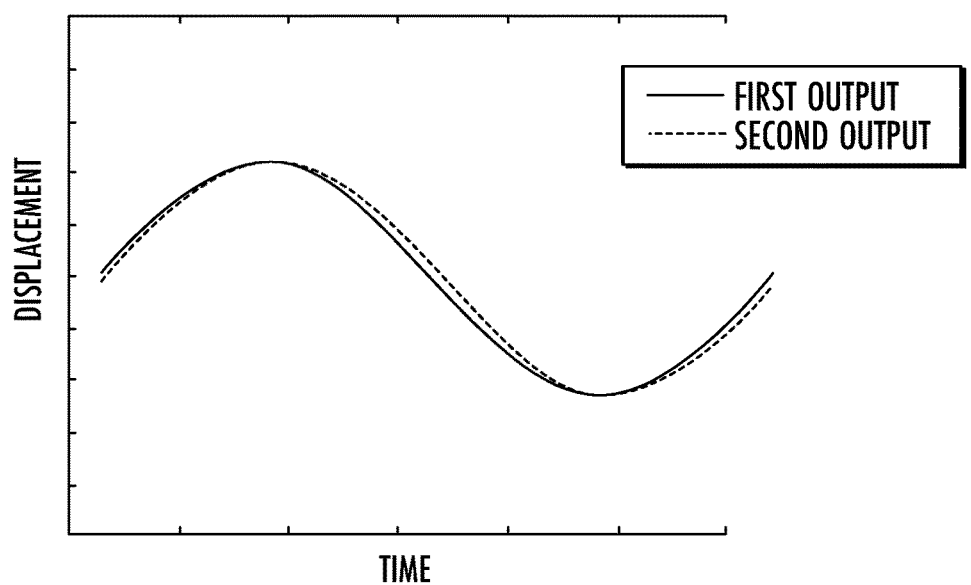
FIG. 5 illustrates an output diagram of an example apparatus in accordance with various embodiments of the present disclosure.
Figure 6:
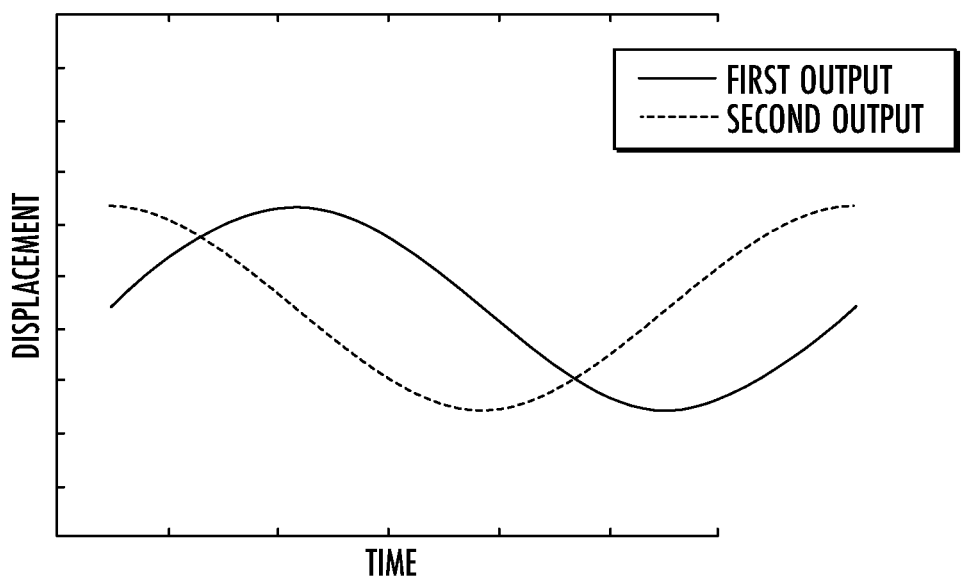
FIG. 6 illustrates an output diagram of an example apparatus in accordance with various embodiments of the present disclosure.
Figure 7:
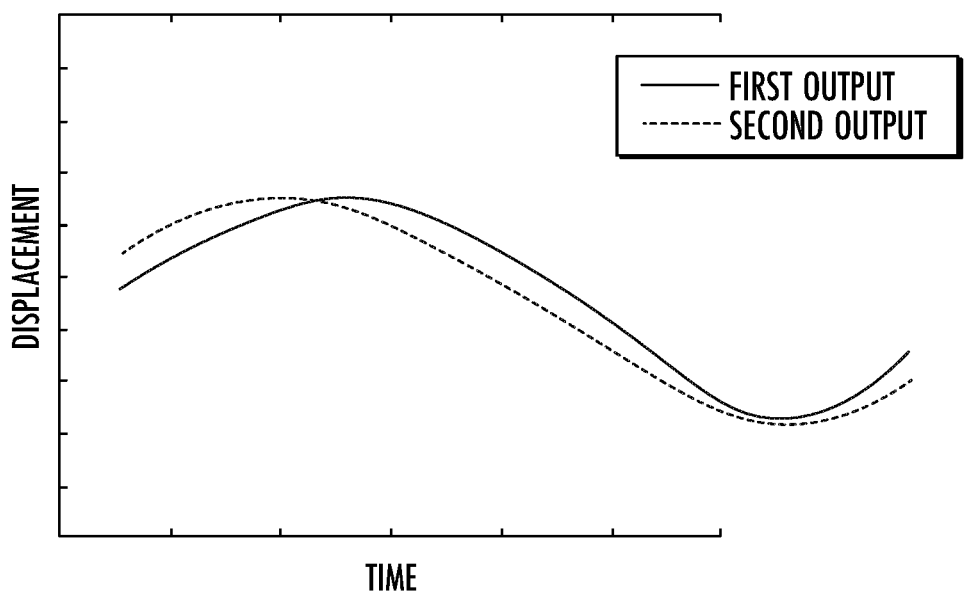
FIG. 7 illustrates an output diagram of an example apparatus in accordance with various embodiments of the present disclosure.

Referring now to FIG. 5, FIG. 6, and FIG. 7, various example output diagrams of example apparatuses of the present disclosure (for example, example apparatuses as described above in connection with FIG. 1, FIG. 2, FIG. 3, and FIG. 4) are illustrated.

In particular, FIG. 5 illustrates example effects that a target magnetic field may have on the outputs of the magnetic sensor elements. FIG. 6 illustrates example effects that a stray magnetic field may have on the outputs of the magnetic sensor elements. FIG. 7 illustrates example effects that a target magnetic field together with a stray magnetic field may have on the outputs of the magnetic sensor elements. As described above, an example apparatus may comprise a first magnetic sensor element and a second magnetic sensor element (for example, the first magnetic sensor element 103 and the second magnetic sensor element 105, respectively, described above in connection with FIG. 1) that are disposed on a magnetic element (for example, the magnetic element 101 described above in connection with FIG. 1). The first magnetic sensor element may generate a first output based on the detected magnetic field, and the second magnetic sensor element may generate a second output based on the detected magnetic field.

FIG. 5 illustrates example first outputs and example second outputs when only a target magnetic field is detected by the first magnetic sensor element and the second magnetic sensor element. As described above, the target magnetic field (for example, produced by the magnetic element 101 as described above in connection with FIG. 1) may cause the same or similar effects on the electrical quantities of the first magnetic sensor element and the second magnetic sensor element. Such that the relationship between the output of the first magnetic sensor element and the second magnetic sensor element are at a predictable phase difference. In some examples, first outputs may overlap or substantially overlap with second outputs, as shown in FIG. 5, such that the predictable phase difference between the output of the first magnetic sensor and the output of the second magnetic sensor is at least substantially zero. In some examples, first outputs may be at a non-zero phase separation from second outputs (example details of which are described and illustrated in connection with at least FIG. 12).

FIG. 6 illustrates example first outputs and example second outputs when only a stray magnetic field is detected by the first magnetic sensor element and the second magnetic sensor element. As described above, because the first magnetic sensor element and the second magnetic sensor element may have different orientations relative to the source of the stray magnetic field, the stray magnetic field may affect the first magnetic sensor element and the second magnetic sensor element differently. As such, the processor element 402 may detect a phase deviation between the first outputs and the second outputs, as shown in FIG. 6. For example, the stray magnetic field may cause the outputs of one of the first magnetic sensor element and/or the second magnetic sensor element to change (relative to the output when no stray magnetic field is present), thereby causing a phase deviation characterized by a change in the phase difference between the output of the first magnetic sensor and the second magnetic sensor such that the phase difference no longer equals the predictable phase difference that is characteristic of the output of the first magnetic sensor and the second magnetic sensor when no stray magnetic field is present.

FIG. 7 illustrates example first outputs and example second outputs when both a target magnetic field and a stray magnetic field are present. In other words, the example outputs as shown in FIG. 7 may show that there is a stray magnetic field interfering with the target magnetic field. Even though the target magnetic field may cause the same or similar effects on the electrical quantities of the first magnetic sensor element and the second magnetic sensor element, because of the stray magnetic field, there may be a phase deviation between the first outputs and the second outputs, as shown in FIG. 7.

Figure 8:
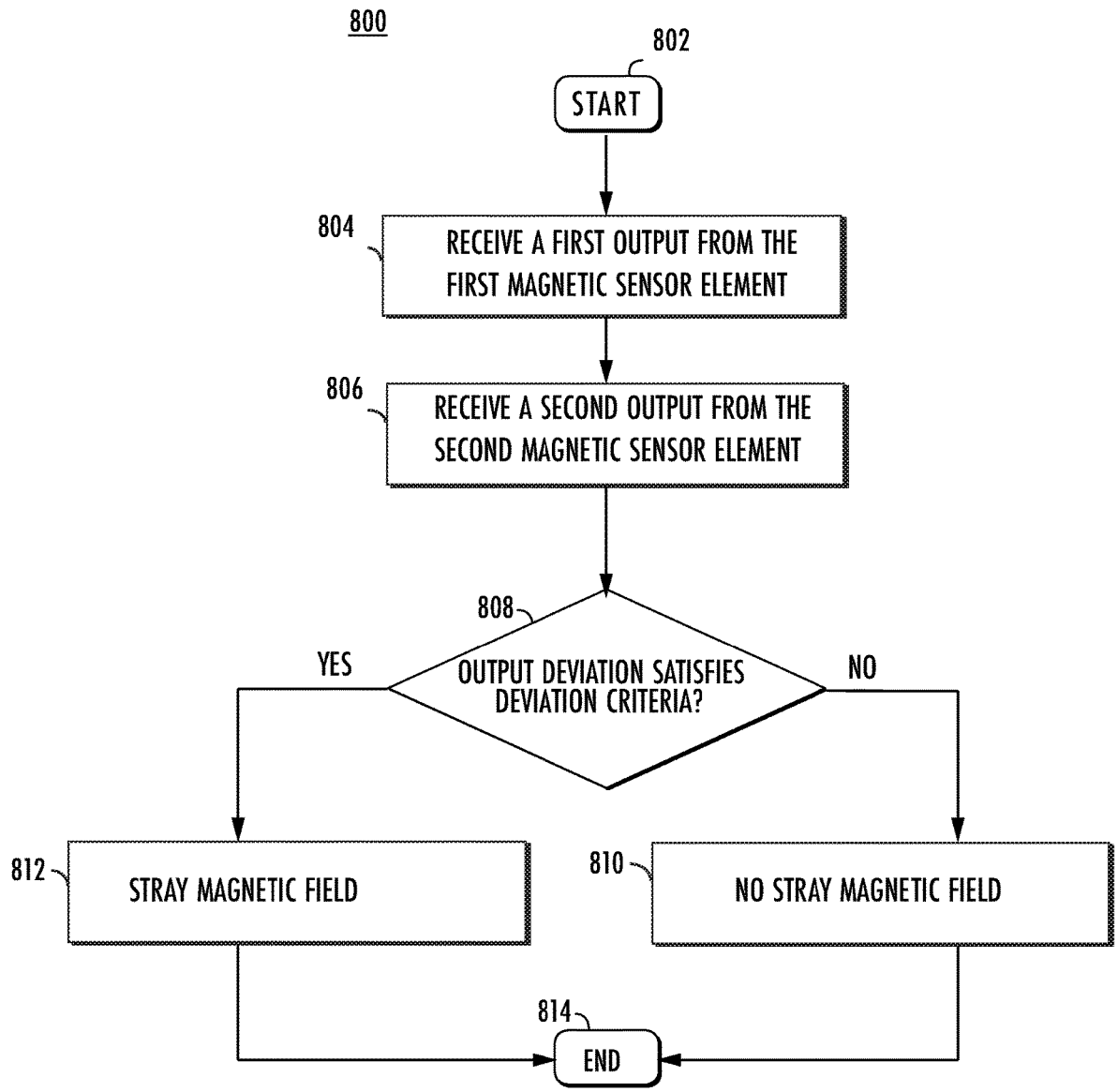
FIG. 8 illustrates a flow diagram in accordance with various embodiments of the present disclosure.

Referring now to FIG. 8, example methods in accordance with various embodiments of the present disclosure are illustrated.

Figure 15:
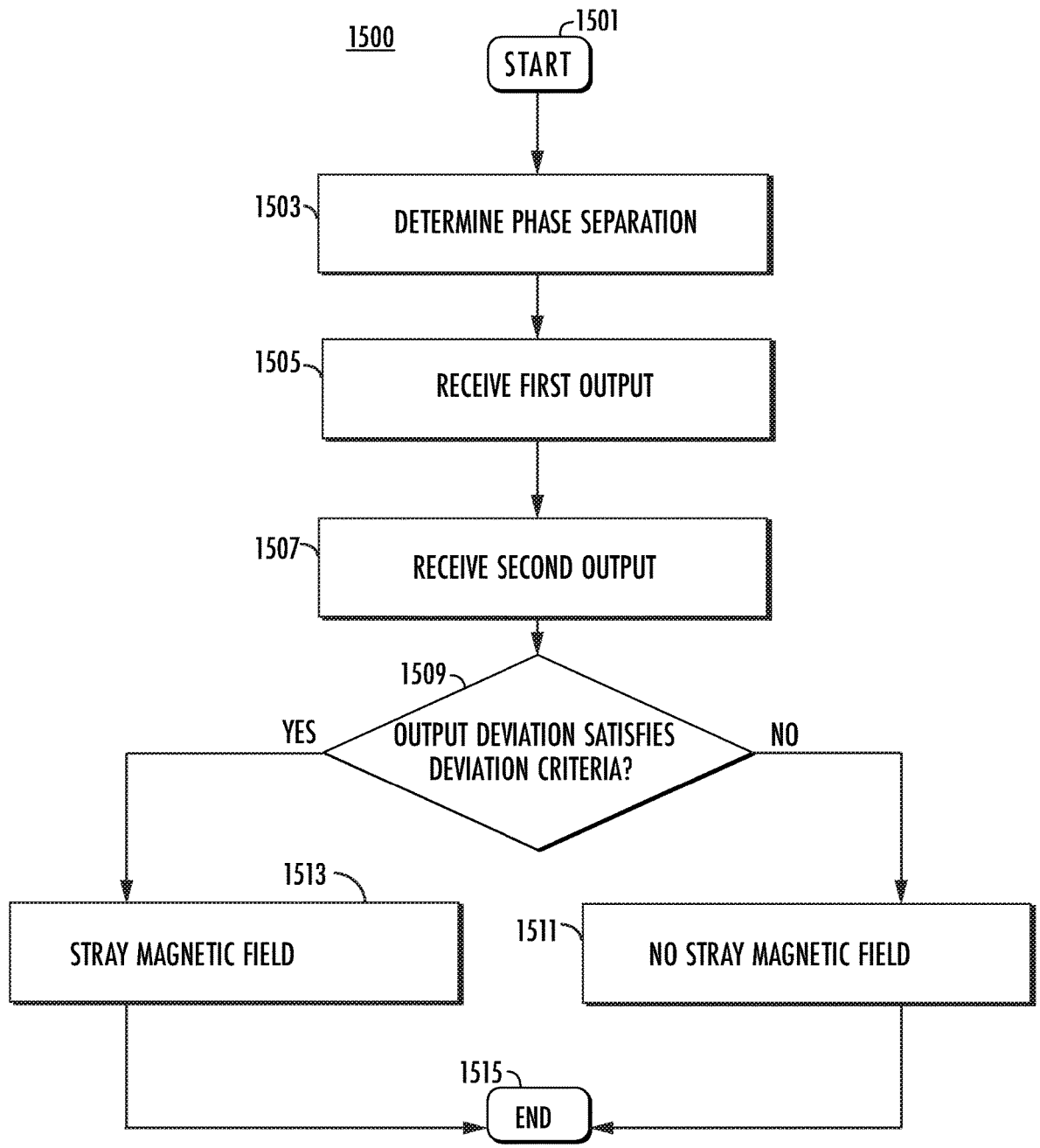
FIG. 15 illustrates a flow diagram in accordance with various embodiments of the present disclosure.

In the present disclosure, including, but not limited to, FIG. 8 and FIG. 15, each block of the flowchart, and combinations of blocks in the flowchart, may be implemented by various means such as hardware, firmware, circuitry and/or other devices associated with execution of software including one or more computer program instructions.

In some examples, one or more of the procedures described in, including, but not limited to, FIG. 8 and FIG. 15, may be embodied by computer program instructions, which may be stored by a memory circuitry (such as a non-transitory memory) of an apparatus employing an embodiment of the present disclosure and executed by a processing circuitry (such as a processor element) of the apparatus. These computer program instructions may direct the apparatus to function in a particular manner, such that the instructions stored in the memory circuitry produce an article of manufacture, the execution of which implements the function specified in the flowchart block(s). Further, the apparatus may comprise one or more other components, such as, for example, one or more magnetic sensor elements described above in connection with FIG. 1. Various components of the apparatus may be in electronic communication between and/or among each other to transmit data to and/or receive data from each other.

In some examples, embodiments may take the form of a computer program product on a non-transitory computer-readable storage medium storing computer-readable program instructions (e.g. computer software). Any suitable computer-readable storage medium may be utilized, including non-transitory hard disks, CD-ROMs, flash memory, optical storage devices, or magnetic storage devices.

Referring back to FIG. 8, an example method 800 in accordance with some embodiments of the present disclosure is illustrated. In particular, the example method 800 illustrates example embodiments of detecting stray magnetic field. In some examples, the method 800 may be performed by a processing circuitry (for example, the processor element 402 described above in connection with FIG. 4).

The method 800 starts at block 802.

At block 804, a processing circuitry (for example, the processor element 402 described above in connection with FIG. 4) may receive a first output from a first magnetic sensor element (for example, the first magnetic sensor element 103 described above in connection with FIG. 1). In some examples, the first output may be in an analog form. In such examples, the processing circuitry may convert the first output to a digital form.

At block 806, a processing circuitry (for example, the processor element 402 described above in connection with FIG. 4) may receive a second output from the second magnetic sensor element (for example, the second magnetic sensor element 105 described above in connection with FIG. 1). In some examples, the second output may be in an analog form. In such examples, the processing circuitry may convert the second output to a digital form.

In accordance with various embodiments of the present disclosure, the processing circuitry may detect the stray magnetic field interfering with the target magnetic field based at least in part on the first output and the second output. For example, at block 808, the processing circuitry may calculate an output deviation between the first output and the second output, and may determine whether the output deviation satisfies an applicable deviation criterion or criteria, which may be utilized to identify the presence of a stray magnetic field.

As described above (for example, at least in connection with FIG. 7), the stray magnetic field may affect outputs of the first magnetic sensor element and the second magnetic sensor element differently due to the different orientations of these magnetic sensor elements. As such, the output deviation may indicate the existence of a stray magnetic field.

In some examples, the output deviation may correspond to a phase deviation between the first output and the second output (for example, as shown in FIG. 7). Additionally, or alternatively, the output deviation may correspond to other difference(s) between the first output and the second output (for example, an amplitude difference).

In some examples, the applicable deviation criterion or criteria may be embodied as a deviation threshold, such that a determination that the output deviation between the first output and the second output meets or exceeds the deviation threshold is indicative of the presence of a stray magnetic field. For example, when the output deviation exceeds the value of the deviation threshold, the processing circuitry may determine that the applicable deviation criterion or criteria are satisfied. In some examples, a deviation threshold may be set based at least in part on suitable parameter(s) (for example, the sensitivity and/or resolution of the first magnetic sensor element and/or the second magnetic sensor element). In some examples, using an applicable deviation criterion or criteria (e.g., a deviation threshold) may mitigate the risk of false positive detections of stray magnetic fields.

In some examples, the applicable deviation criterion or criteria may be embodied as a determination of whether the value of the output deviation is different from an applicable value (e.g., zero). For example, when the value of the output deviation is different from zero (i.e. there is a difference between the first output and the second output), the processing circuitry may determine that the applicable deviation criterion or criteria are satisfied (i.e. there is a stray magnetic field). When the output deviation equals to zero (i.e. there is no difference between the first output and the second output), the processing circuitry may determine that the applicable deviation criterion or criteria are not satisfied (i.e. there is no stray magnetic field).

In response to determining that the applicable deviation criterion or criteria are not satisfied, a processing circuitry (for example, the processor element 402 described above in connection with FIG. 4) may proceed to block 810, and may determine that there is no stray magnetic field.

In some examples, subsequent to determining that there is no stray magnetic field, the first magnetic sensor element and/or the second magnetic sensor element may monitor the target magnetic field (for example, changes within the target magnetic field), which may be indicative of changes in the positioning (for example, angular positioning) of the magnetic element.

In response to determining that the applicable deviation criterion or criteria are satisfied, a processing circuitry (for example, the processor element 402 described above in connection with FIG. 4) may proceed to block 812, and may determine that a stray magnetic field is detected by the one or more sensor elements.

In some examples, the processing circuitry may trigger a warning alert in response to determining that a stray magnetic field is detected by the sensor elements. For example, the processing circuitry may cause an example speaker element to output an audio alert, an example light-emitting diode (LED) element to output a visual alert, and/or an example vibrator element to output a vibration.

Additionally, or alternatively, in response to detecting the stray magnetic field, the processor circuitry may be further configured to disable position outputs associated with the apparatus. For example, the apparatus may be configured to generate position outputs based on the first output and/or the second output, and the position outputs may indicate absolute positions or relative displacements of a target object. When the processing circuitry determines that there is a stray magnetic field (that may interfere with the target magnetic field), the processing circuitry may disable the position outputs to, for example, prevent undesired actuation of a device as described above. In some examples, the processing circuitry may disable the position outputs by preventing the position outputs from being utilized to trigger an applicable operation. In some examples, the processing circuitry may generate and transmit a warning output that may indicate, for example, the accuracy of the position detected by the position sensor may be affected by a stray magnetic field.

The method 800 ends at block 814.

Figure 9:
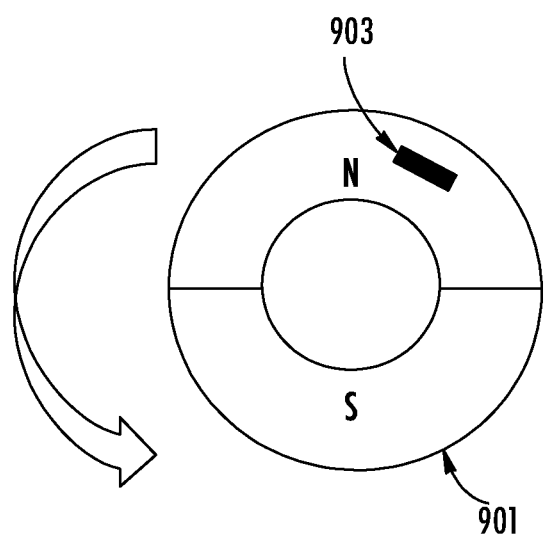
FIG. 9 illustrates a schematic diagram of an example apparatus in accordance with various embodiments of the present disclosure.

Referring now to FIG. 9, an example apparatus in accordance with various embodiments of the present disclosure is shown. In the example embodiment as shown in FIG. 9, the example apparatus may comprise a first magnetic sensor package 903, which may be disposed on and/or proximate a magnetic element 901. In some examples, the example apparatus may further comprise a processor element that is electronically coupled to the first magnetic sensor package 903, example details of which are described and illustrated in at least FIG. 11 of the present disclosure.

Figure 10:
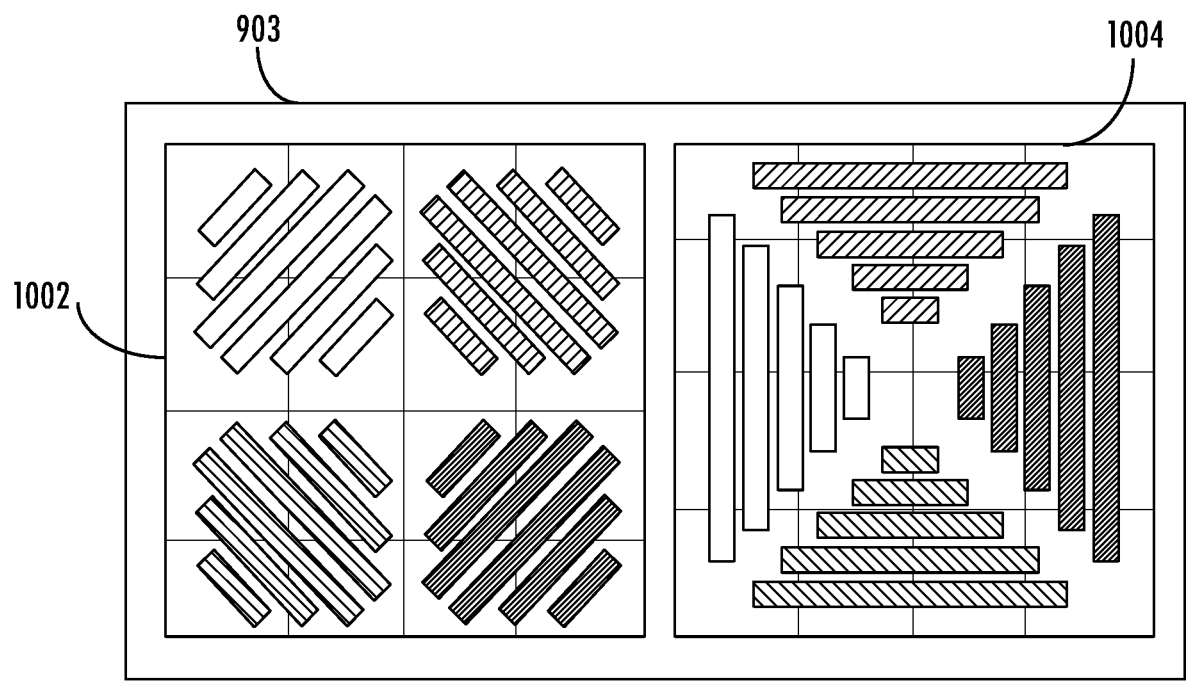
FIG. 10 illustrates a block diagram of an example apparatus in accordance with various embodiments of the present disclosure.

In some examples, the first magnetic sensor package 903 may comprise a first magnetic sensor element and a second magnetic sensor element that are integrated within the first magnetic sensor package 903. For example, FIG. 10 illustrates an example block diagram of the first magnetic sensor package 903. In the embodiment as shown in FIG. 10, the first magnetic sensor package 903 may comprise a first magnetic sensor element 1002 and a second magnetic sensor element 1004.

In some examples, the first magnetic sensor element 1002 may be similar to the first magnetic sensor element 103 described above in connection with FIG. 1 and FIG. 2. In some examples, the second magnetic sensor element 1004 may be similar to the second magnetic sensor element 105 described above in connection with FIG. 1 and FIG. 3. For example, the first magnetic sensor element 1002 may generate a first output, and the second magnetic sensor element 1004 may generate a second output.

Figure 11:
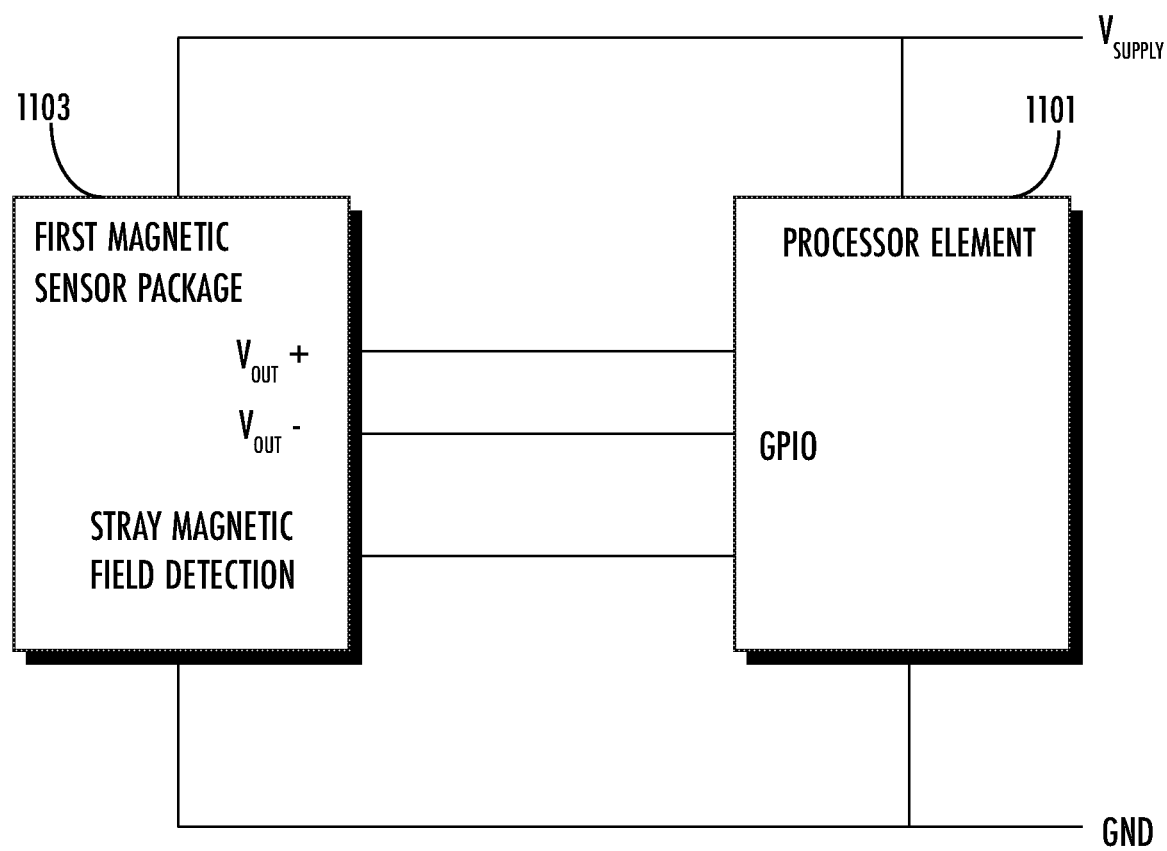
FIG. 11 illustrates a circuit diagram of an example apparatus in accordance with various embodiments of the present disclosure.

Referring now to FIG. 11, an example circuit diagram illustrating various electronic elements of an example apparatus in accordance with the present disclosure is shown. For example, the example apparatus may comprise a processor element 1101 that is electronically coupled to the first magnetic sensor package 1103. The electronic elements may be powered by a voltage source $V_{SUPPLY}$.

In some examples, the first magnetic sensor package and the processor element may be contained in the same integrated circuit. For example, in the example embodiment as shown in FIG. 11, the first magnetic sensor element and the second magnetic sensor element (which are integrated within the first magnetic sensor package 1103) may be contained in the same integrated circuit as the processor element 1101.

Similar to the processor element 402 described above in connection with FIG. 4, the processor element 1101 may be in the form of, for example but not limited to, an application-specific integrated circuit (ASIC) or a central processing unit (CPU). In some examples, the processor element 1101 may be in other suitable form(s) without deviating from the scope of the present disclosure.

In some examples, the first magnetic sensor package 1103 may be similar to the first magnetic sensor package 903 described above in connection with FIG. 9 and FIG. 10. The first magnetic sensor package 1103 may generate and transmit outputs to the processor element 1101. For example, a first magnetic sensor element within the first magnetic sensor package 1103 may generate and transmit a first output to the processor element 1101, and a second magnetic sensor element within the first magnetic sensor package 1103 may generate and transmit a second output to the processor element 1101. Examples of first output and second output are described and illustrated in at least FIG. 12, FIG. 13, and FIG. 14 of the present disclosure.

While the embodiment as illustrated in FIG. 11 shows differential outputs (i.e. $V_{OUT}+$ and $V_{OUT}-$), it is noted that the scope of the present disclosure is not limited to differential outputs. For example, the first magnetic sensor element and/or the second magnetic sensor element within the first magnetic sensor package 1103 may generate a single-ended output.

Additionally, or alternatively, the first magnetic sensor package 1103 may generate and transmit an output that indicates whether there is a stray magnetic field, based on, for example, example methods described in connection with at least FIG. 8 above and/or FIG. 15 below.

Additionally, or alternatively, the processor element 1101 may receive outputs from first magnetic sensor package 1103 through one or more General Purpose Input/output (GPIO) pins, and may determine whether there is a stray magnetic field based on the outputs, example details of which are described and illustrated in connection with at least FIG. 15 below.

Figure 12:
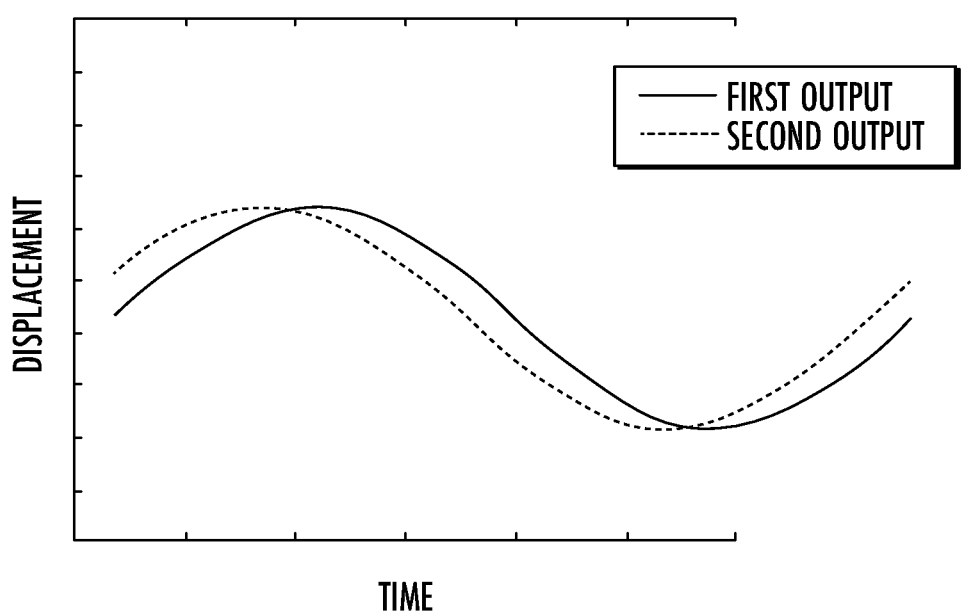
FIG. 12 illustrates an output diagram of an example apparatus in accordance with various embodiments of the present disclosure.
Figure 13:
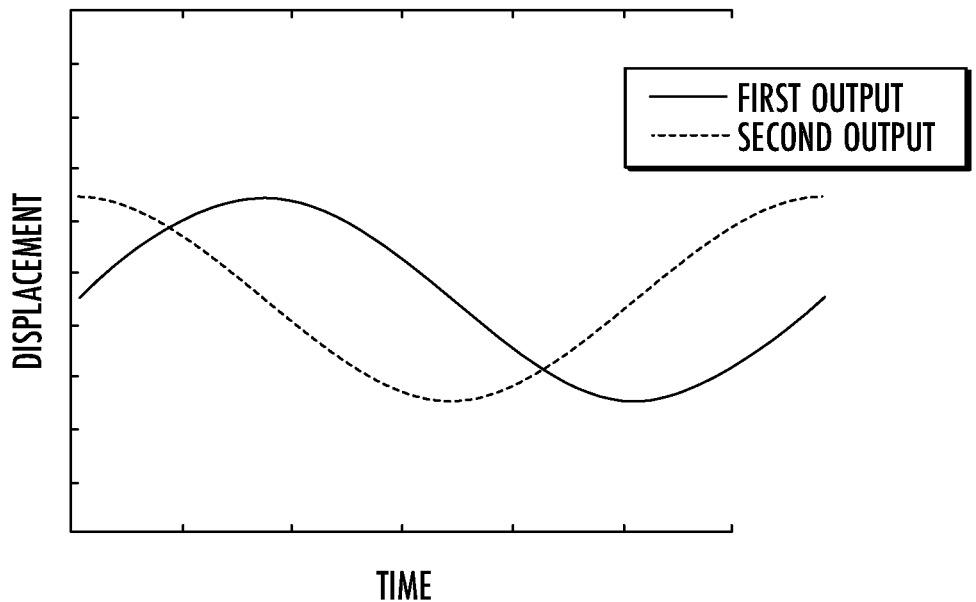
FIG. 13 illustrates an output diagram of an example apparatus in accordance with various embodiments of the present disclosure.
Figure 14:
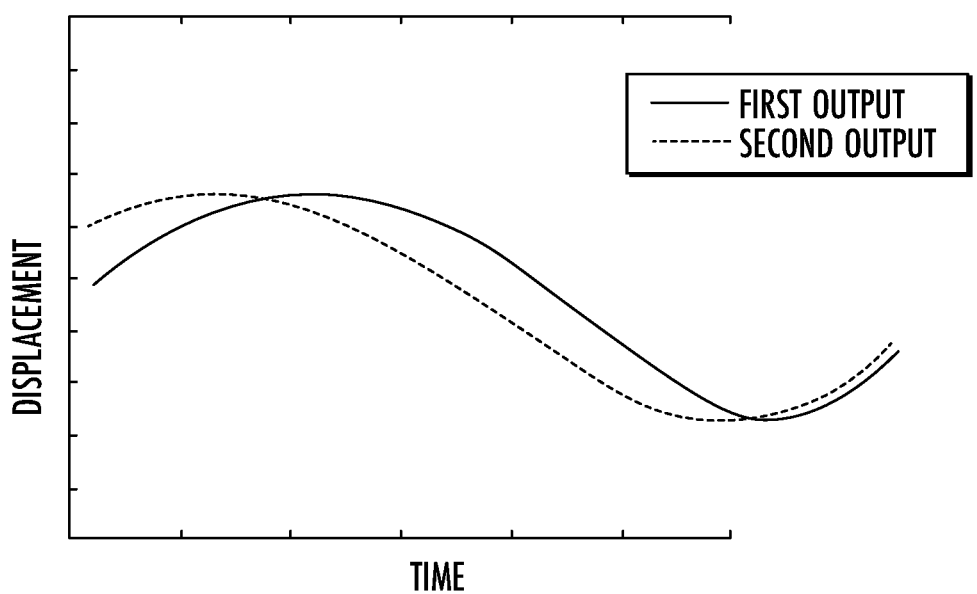
FIG. 14 illustrates an output diagram of an example apparatus in accordance with various embodiments of the present disclosure.

Referring now to FIG. 12, FIG. 13, and FIG. 14, various example output diagrams of example apparatuses of the present disclosure (for example, example apparatuses as described above in connection with FIG. 9, FIG. 10, and FIG. 11) are illustrated.

In particular, FIG. 12 illustrates example effects that a target magnetic field may have on the outputs of magnetic sensor elements within a magnetic sensor package (for example, the first magnetic sensor element 1002 and the second magnetic sensor element 1004 within the first magnetic sensor package 903 described above in connection with FIG. 9 and FIG. 10). In some examples, the first magnetic sensor element and the second magnetic sensor element within the magnetic sensor package may not be in a forty-five-degree (45°) arrangement with each other (in comparison with the example arrangement of the first magnetic sensor element 103 and the second magnetic sensor element 105 described above in connection with FIG. 1). As such, there may be a phase separation between the first output and the second output (even when there is no stray magnetic field) as shown in FIG. 12. In some examples, the phase separation may be determined based at least in part on a first position associated with the first magnetic sensor element of the magnetic sensor package and the second position associated with the second magnetic sensor element of the magnetic sensor package (example details of which are described and illustrated in connection with at least FIG. 15).

FIG. 13 illustrates example effects that a stray magnetic field may have on the outputs of magnetic sensor elements within a magnetic sensor package (for example, the first magnetic sensor element 1002 and the second magnetic sensor element 1004 within the first magnetic sensor package 903 described above in connection with FIG. 9 and FIG. 10). As shown in FIG. 13, the stray magnetic field may affect the first outputs and the second outputs differently, creating a deviation between the first outputs and the second outputs.

FIG. 14 illustrates example effects that a target magnetic field together with a stray magnetic field may have on the outputs of magnetic sensor elements within a magnetic sensor package (for example, the first magnetic sensor element 1002 and the second magnetic sensor element 1004 within the first magnetic sensor package 903 described above in connection with FIG. 9 and FIG. 10).

Referring now to FIG. 15, example methods in accordance with various embodiments of the present disclosure are illustrated. In particular, the example method 1500 illustrates example embodiments of detecting stray magnetic field. In some examples, the method 1500 may be performed by a processing circuitry (for example, the processor element 1101 described above in connection with FIG. 11).

The method 1500 starts at block 1501.

At block 1503, a processing circuitry (for example, the processor element 1101 described above in connection with FIG. 11) may determine a phase separation associated with the first magnetic sensor element and the second magnetic sensor element of a first magnetic sensor package (for example, the first magnetic sensor element 1002 and the second magnetic sensor element 1004 within the first magnetic sensor package 903 described above in connection with FIG. 9 and FIG. 10).

As shown in FIG. 12, the phase separation may correspond to the output difference between the first magnetic sensor element and the second magnetic sensor element caused by a target magnetic field. In some examples, the processing circuitry may calculate the phase separation based on the position difference (e.g. angular difference) between the first position of the first magnetic sensor element and the second position of the second magnetic sensor element. Because the first magnetic sensor element and the second magnetic sensor element are integrated within the first magnetic sensor package, the position difference between the first position and the second position may remain unchanged. In other words, the phase separation may remain unchanged. In some examples, the processing circuitry may store the value of the phase separation in a memory circuitry that is electronically coupled to the processing circuitry.

At block 1505, a processing circuitry (for example, the processor element 1101 described above in connection with FIG. 11) may receive a first output from a first magnetic sensor element within the first magnetic sensor package (for example, from the first magnetic sensor element 1002 within the first magnetic sensor package 903 described above in connection with FIG. 9 and FIG. 10).

At block 1507, a processing circuitry (for example, the processor element 1101 described above in connection with FIG. 11) may receive a second output from a second magnetic sensor element within the first magnetic sensor package (for example, from the second magnetic sensor element 1004 within the first magnetic sensor package 903 described above in connection with FIG. 9 and FIG. 10).

At block 1509, a processing circuitry (for example, the processor element 1101 described above in connection with FIG. 11) may calculate an output deviation between the first output and the second output, and may determine whether the output deviation satisfies an applicable deviation criterion or criteria.

In some examples, the deviation criterion or criteria may be determined based on the phase separation calculated at block 1503. As described above, the phase separation may be caused by a target magnetic field. In some examples, the applicable deviation criterion or criteria may be embodied as a determination of whether the value of the output deviation is different from the phase separation. For example, when the output deviation is the same as the phase separation (i.e. the output deviation is only caused by the target magnetic field), the processing circuitry may determine that the deviation criterion or criteria are not satisfied (i.e. there is no stray magnetic field). When the output deviation is different from the phase separation (i.e. the output deviation is at least partially caused by the stray magnetic field), the processing circuitry may determine that the deviation criterion or criteria are satisfied (i.e. there is a stray magnetic field).

Additionally, or alternatively, the processing circuitry may set the deviation criterion or criteria based on other suitable parameters or thresholds, such as those described above in connection with block 808 of FIG. 8.

In response to determining that the applicable deviation criterion or criteria are not satisfied, a processing circuitry (for example, the processor element 1101 described above in connection with FIG. 11) may proceed to block 1511, and may determine that there is no stray magnetic field, similar to block 810 described above in connection with FIG. 8.

In response to determining that the applicable deviation criterion or criteria are satisfied, a processing circuitry (for example, the processor element 1101 described above in connection with FIG. 11) may proceed to block 1513, and may determine that there is a stray magnetic field, similar to block 812 described above in connection with FIG. 8.

For example, in response to detecting the stray magnetic field, the processor circuitry may be further configured to disable position outputs associated with the apparatus. The apparatus may be configured to generate position outputs based on the first output and/or the second output, and the position outputs may indicate absolute positions or relative displacements of a target object. When the processing circuitry determines that there is a stray magnetic field (that may interfere with the target magnetic field), the processing circuitry may disable the position outputs to, for example, prevent undesired actuation of a device as described above.

The method 1500 ends at block 1515.

Figure 16:
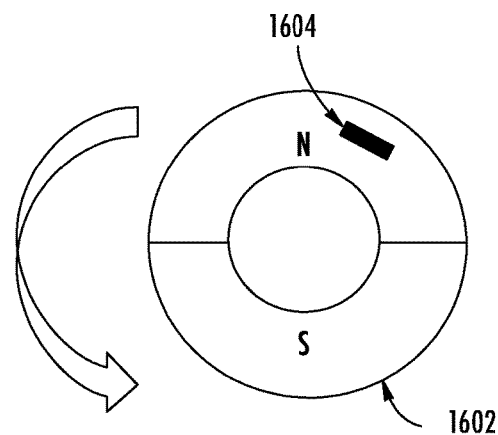
FIG. 16 illustrates a schematic diagram of an example apparatus in accordance with various embodiments of the present disclosure.

Referring now to FIG. 16, an example apparatus in accordance with various embodiments of the present disclosure is shown. In the example embodiment as shown in FIG. 16, the example apparatus may comprise a first magnetic sensor package 1604, which may be disposed on and/or proximate a magnetic element 1602. In some examples, the example apparatus may further comprise a processor element that is electronically coupled to the first magnetic sensor package 1604, similar to those described above in connection with at least FIG. 11.

Figure 17:
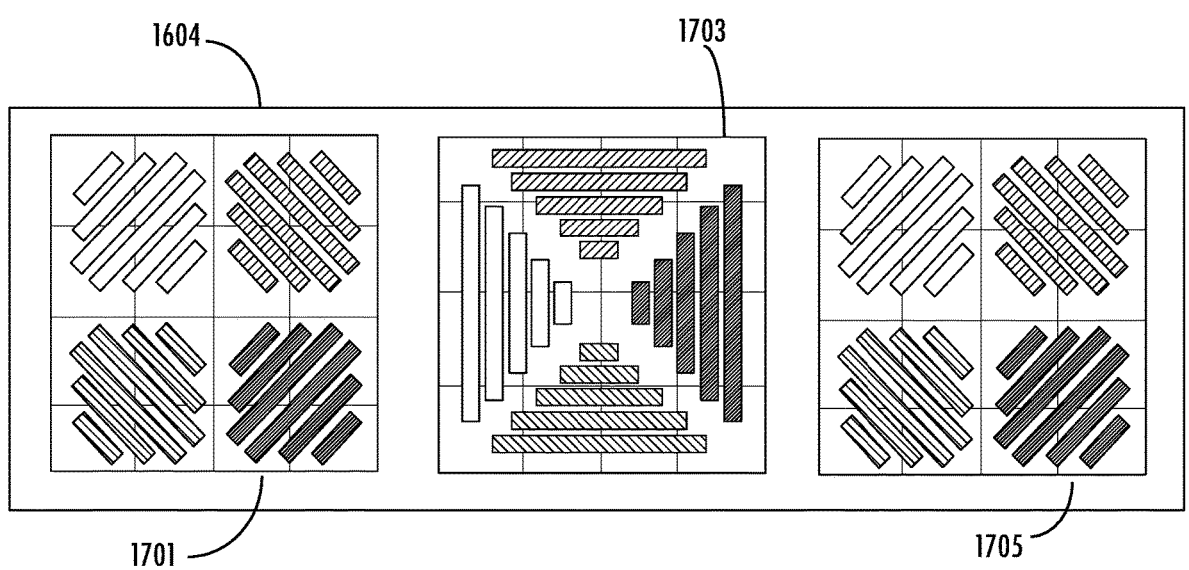
FIG. 17 illustrates a block diagram of an example apparatus in accordance with various embodiments of the present disclosure.

In some examples, the first magnetic sensor package 1604 may comprise a first magnetic sensor element, a second magnetic sensor element, and a third magnetic sensor element that are integrated within the first magnetic sensor package 1604. For example, FIG. 17 illustrates an example block diagram of the first magnetic sensor package 1604. In the embodiment as shown in FIG. 17, the first magnetic sensor package 1604 may comprise a first magnetic sensor element 1701, a second magnetic sensor element 1703, and a third magnetic sensor element 1705. In some examples, the first magnetic sensor element 1701, the second magnetic sensor element 1703, the third magnetic sensor element 1705, and the processor element may be contained in the same integrated circuit, similar to those described above in connection with FIG. 4 and/or FIG. 11.

In some examples, the first magnetic sensor element 1701, the second magnetic sensor element 1703, and/or the third magnetic sensor element 1705 may be similar to the first magnetic sensor element 103 described above in connection with FIG. 1 and FIG. 2 and/or the second magnetic sensor element 105 described above in connection with FIG. 1 and FIG. 3. For example, the first magnetic sensor element 1701 may generate a first output, the second magnetic sensor element 1703 may generate a second output, and the third magnetic sensor element 1705 may generate a third output.

Figure 18:
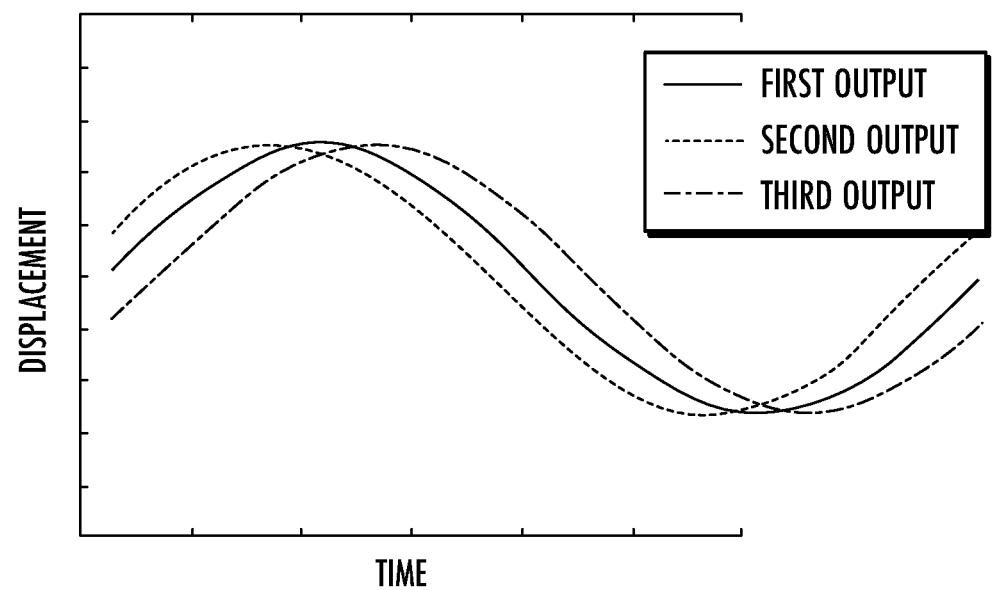
FIG. 18 illustrates an output diagram of an example apparatus in accordance with various embodiments of the present disclosure.
Figure 19:
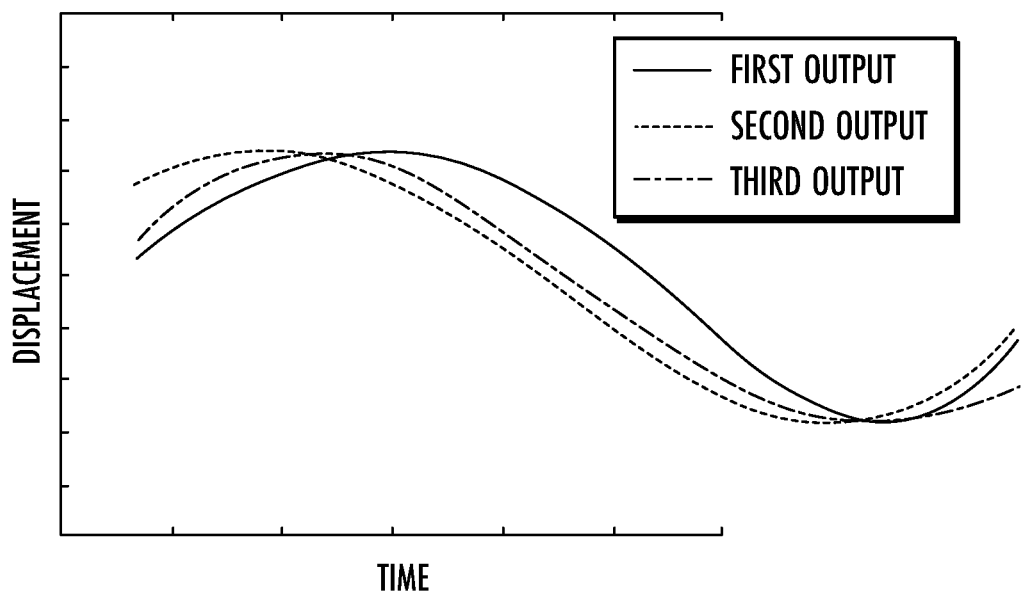
FIG. 19 illustrates an output diagram of an example apparatus in accordance with various embodiments of the present disclosure.

Referring now to FIG. 18 and FIG. 19, various example output diagrams of example apparatuses of the present disclosure (for example, example apparatuses as described above in connection with FIG. 16 and FIG. 17) are illustrated.

In particular, FIG. 18 illustrates example effects that a target magnetic field may have on the outputs of magnetic sensor elements within a magnetic sensor package (for example, the first magnetic sensor element 1701, the second magnetic sensor element 1703, and the third magnetic sensor element 1705 within the first magnetic sensor package 1604 described above in connection with FIG. 16 and FIG. 17). In some examples, the first magnetic sensor element, the second magnetic sensor element, and the third magnetic sensor element within the magnetic sensor package may not be in a forty-five-degree (45°) arrangement with one other (in comparison with the example arrangement of the first magnetic sensor element 103 and the second magnetic sensor element 105 described above in connection with FIG. 1). As such, there may be phase separations between the first output, the second output, and the third output.

FIG. 19 illustrates example effects that a target magnetic field together with a stray magnetic field may have on the outputs of magnetic sensor elements within a magnetic sensor package (for example, the first magnetic sensor element 1701, the second magnetic sensor element 1703, and the third magnetic sensor element 1705 within the first magnetic sensor package 1604 described above in connection with FIG. 16 and FIG. 17).

In some examples, a processor element may determine whether there is a stray magnetic field based on the first output, the second output, and the third output. For example, the processor element may calculate a first output deviation between the first output and the second output, and/or a second output deviation between the second output and the third output, and/or a third output deviation between the first output and the third output. To detect the stray magnetic field, the processor element may determine whether the first output deviation and/or the second output deviation and/or the third output deviation satisfies one or more applicable deviation criteria, similar to those described above in connection with at least FIG. 8 and/or FIG. 15.

Figure 20:
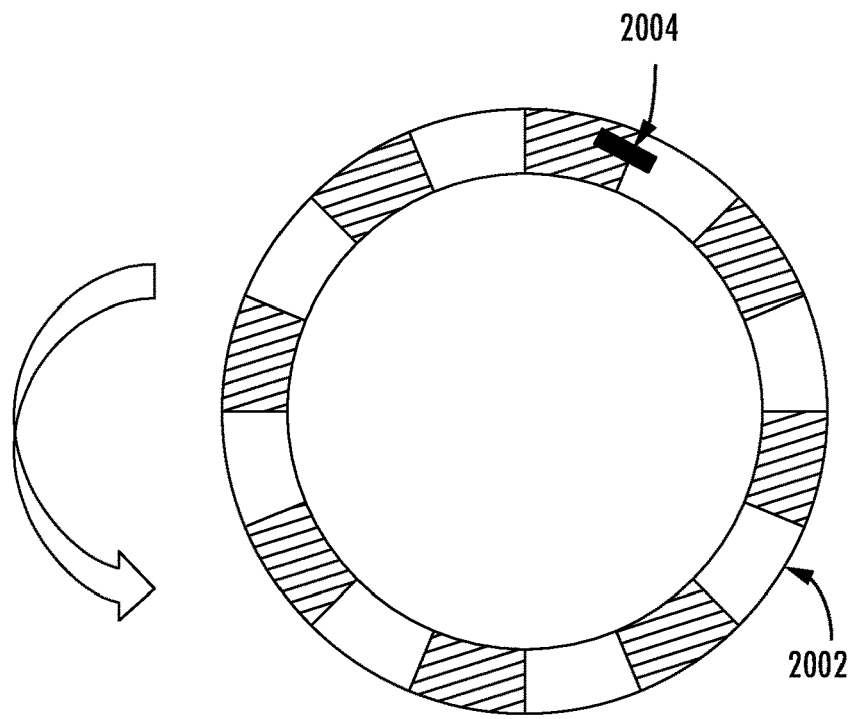
FIG. 20 illustrates a schematic diagram of an example apparatus in accordance with various embodiments of the present disclosure.

Referring now to FIG. 20, an example apparatus in accordance with various embodiments of the present disclosure is shown. In the example embodiment as shown in FIG. 20, the example apparatus may comprise a first magnetic sensor package 2004, which may be disposed on and/or proximate a magnetic element 2002. In some examples, the example apparatus may further comprise a processor element that is electronically coupled to the first magnetic sensor package 2004, similar to those described above in connection with at least FIG. 11.

In comparison with the magnetic element 901 described above in connection with FIG. 9, the magnetic element 2002 of FIG. 20 may be a multipole ring magnet.

Figure 21:
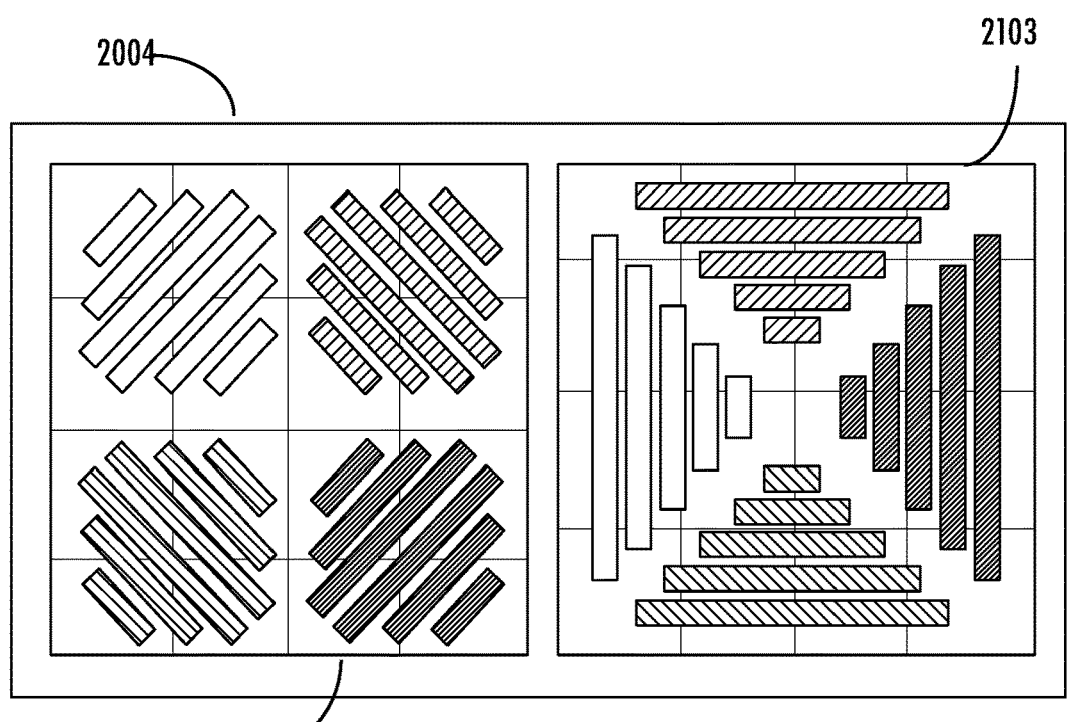
FIG. 21 illustrates a block diagram of an example apparatus in accordance with various embodiments of the present disclosure.

Similar to the first magnetic sensor package 903 described above in connection with FIG. 9 and FIG. 10, the first magnetic sensor package 2004 may comprise a first magnetic sensor element and a second magnetic sensor element that are integrated within the first magnetic sensor package 2004. For example, FIG. 21 illustrates an example block diagram of the first magnetic sensor package 2004. In the embodiment as shown in FIG. 21, the first magnetic sensor package 2004 may comprise a first magnetic sensor element 2101 and a second magnetic sensor element 2103.

In some examples, the first magnetic sensor element 2101 may be similar to the first magnetic sensor element 103 described above in connection with FIG. 1 and FIG. 2. In some examples, the second magnetic sensor element 2103 may be similar to the second magnetic sensor element 105 described above in connection with FIG. 1 and FIG. 3. For example, the first magnetic sensor element 2101 may generate a first output, and the second magnetic sensor element 2103 may generate a second output.

Figure 22:
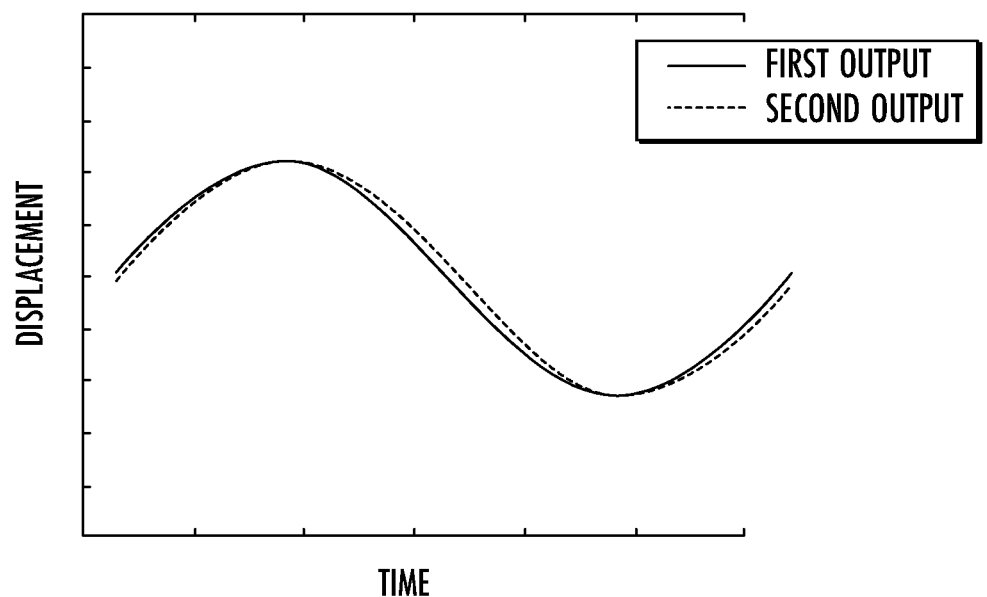
FIG. 22 illustrates an output diagram of an example apparatus in accordance with various embodiments of the present disclosure.
Figure 23:
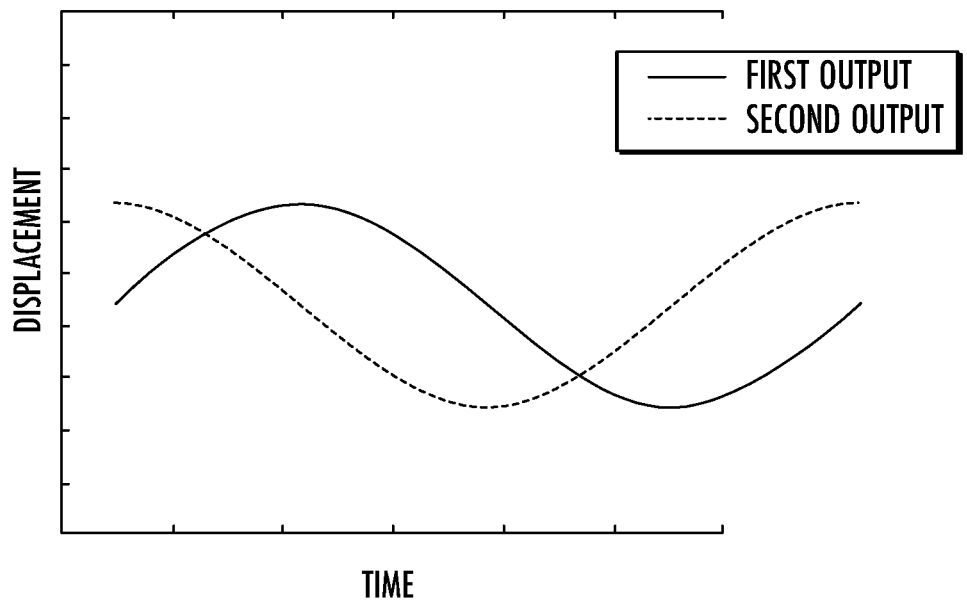
FIG. 23 illustrates an output diagram of an example apparatus in accordance with various embodiments of the present disclosure.
Figure 24:
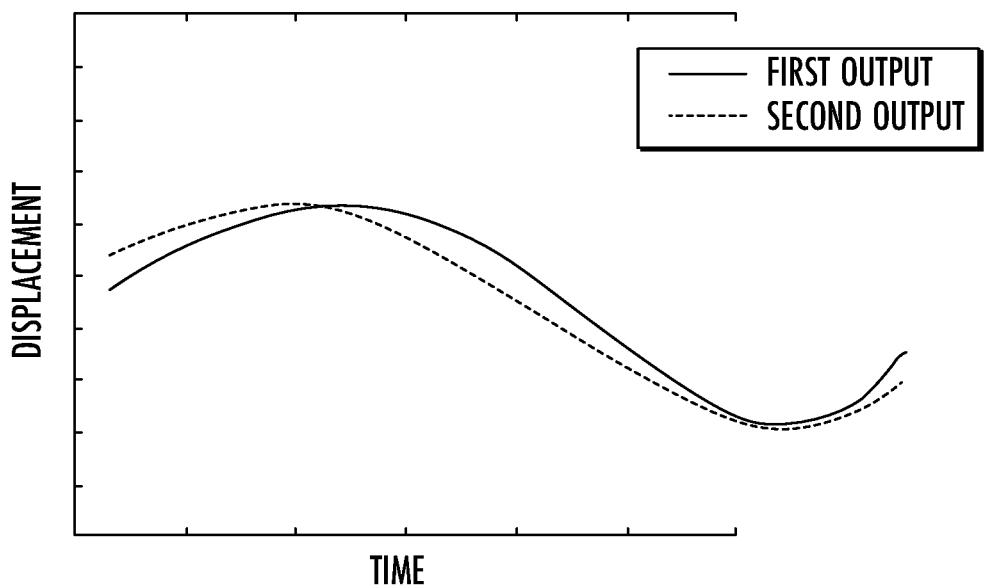
FIG. 24 illustrates an output diagram of an example apparatus in accordance with various embodiments of the present disclosure.

Referring now to FIG. 22, FIG. 23, and FIG. 24, various example output diagrams of example apparatuses of the present disclosure (for example, example apparatuses as described above in connection with FIG. 20 and FIG. 21) are illustrated.

In particular, FIG. 22 illustrates example effects that a target magnetic field may have on the outputs of the magnetic sensor elements (for example, the first magnetic sensor element 2101 and the second magnetic sensor element 2103 within the first magnetic sensor package 2004 described above in connection with FIG. 20 and FIG. 21). FIG. 23 illustrates example effects that a stray magnetic field may have on the outputs of the magnetic sensor elements (for example, the first magnetic sensor element 2101 and the second magnetic sensor element 2103 within the first magnetic sensor package 2004 described above in connection with FIG. 20 and FIG. 21). FIG. 24 illustrates example effects that a target magnetic field together with a stray magnetic field may have on the outputs of the magnetic sensor elements (for example, the first magnetic sensor element 2101 and the second magnetic sensor element 2103 within the first magnetic sensor package 2004 described above in connection with FIG. 20 and FIG. 21).

In some examples, a processor element may determine whether there is a stray magnetic field based on the first output and the second output, similar to those described in connection with at least FIG. 8 and/or FIG. 15 above.

Figure 25:
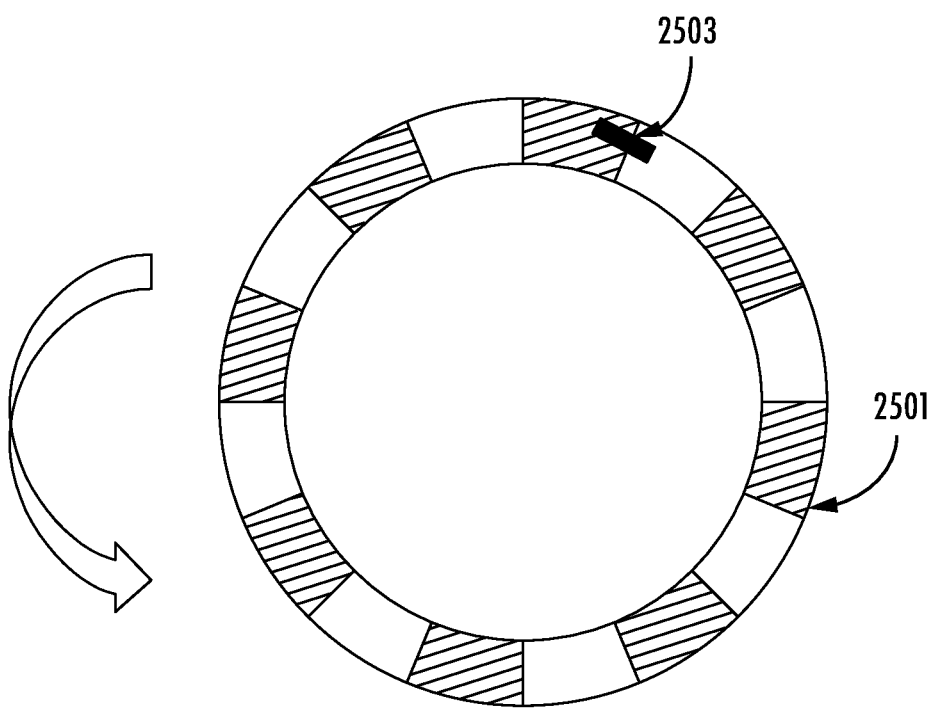
FIG. 25 illustrates a schematic diagram of an example apparatus in accordance with various embodiments of the present disclosure.

Referring now to FIG. 25, an example apparatus in accordance with various embodiments of the present disclosure is shown. In the example embodiment as shown in FIG. 25, the example apparatus may comprise a first magnetic sensor package 2503, which may be disposed on and/or proximate a magnetic element 2501. In some examples, the example apparatus may further comprise a processor element that is electronically coupled to the first magnetic sensor package 2503, similar to those described above in connection with at least FIG. 11.

In comparison with the magnetic element 1602 described above in connection with FIG. 16, the magnetic element 2501 of FIG. 25 may be a multipole ring magnet.

Figure 26:
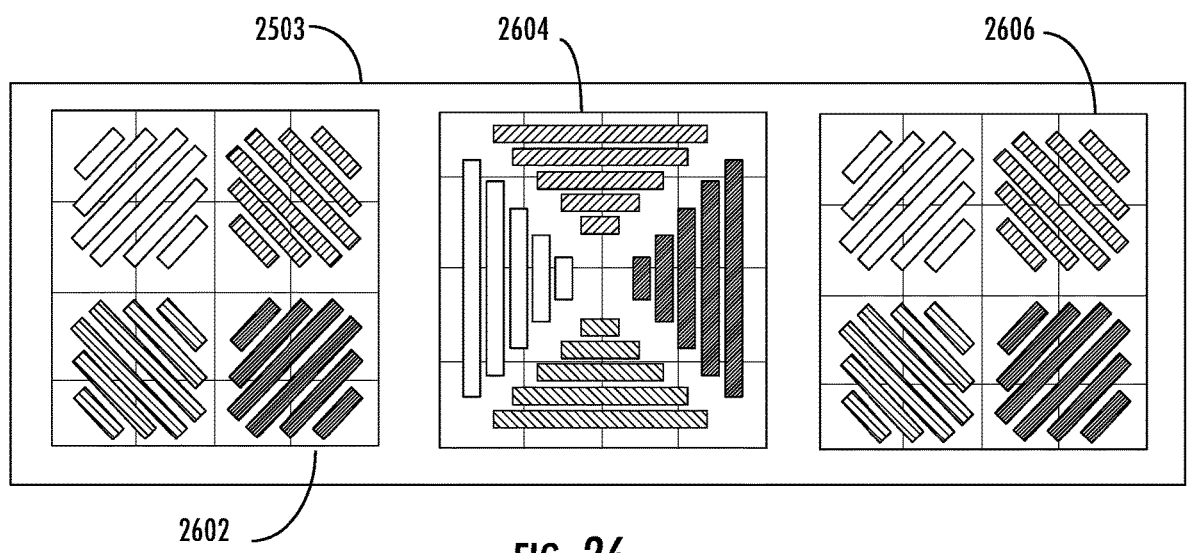
FIG. 26 illustrates a block diagram of an example apparatus in accordance with various embodiments of the present disclosure.

Similar to the first magnetic sensor package 1604 described above in connection with FIG. 16 and FIG. 17, the first magnetic sensor package 2503 may comprise a first magnetic sensor element, a second magnetic sensor element, and a third magnetic sensor element that are integrated within the first magnetic sensor package 2503. For example, FIG. 26 illustrates an example block diagram of the first magnetic sensor package 2503. In the embodiment as shown in FIG. 26, the first magnetic sensor package 2503 may comprise a first magnetic sensor element 2602, a second magnetic sensor element 2604, and a third magnetic sensor element 2606.

In some examples, the first magnetic sensor element 2602, the second magnetic sensor element 2604, and/or the third magnetic sensor element 2606 may be similar to the first magnetic sensor element 103 described above in connection with FIG. 1 and FIG. 2 and/or the second magnetic sensor element 105 described above in connection with FIG. 1 and FIG. 3. For example, the first magnetic sensor element 2602 may generate a first output, the second magnetic sensor element 2604 may generate a second output, and the third magnetic sensor element 2606 may generate a third output.

Figure 27:
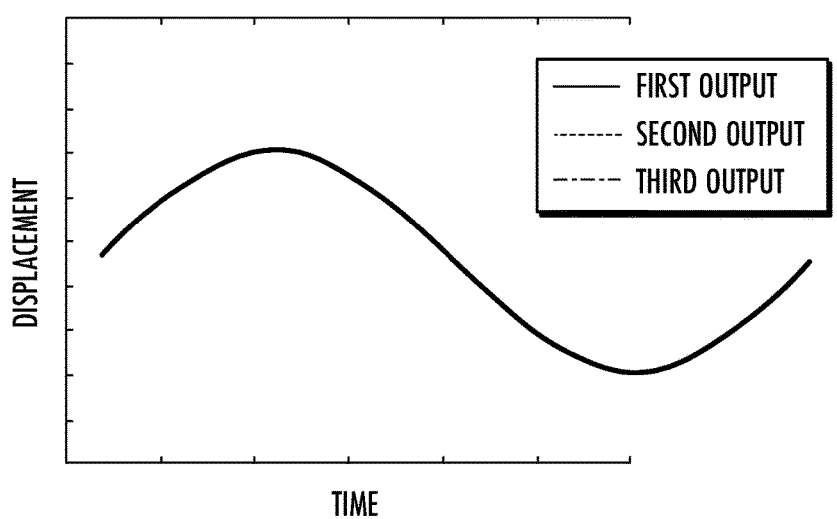
FIG. 27 illustrates an output diagram of an example apparatus in accordance with various embodiments of the present disclosure.
Figure 28:
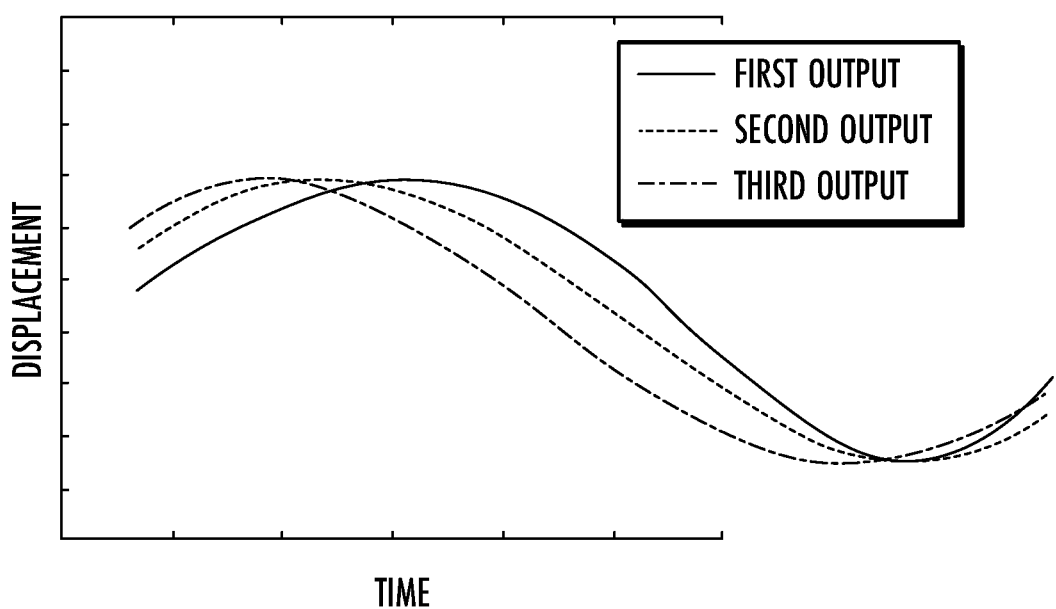
FIG. 28 illustrates an output diagram of an example apparatus in accordance with various embodiments of the present disclosure.

Referring now to FIG. 27 and FIG. 28, various example output diagrams of example apparatuses of the present disclosure (for example, example apparatuses as described above in connection with FIG. 25 and FIG. 26) are illustrated.

In particular, FIG. 27 illustrates example effects that a target magnetic field may have on the outputs of magnetic sensor elements within a magnetic sensor package (for example, the first magnetic sensor element 2602, the second magnetic sensor element 2604, and the third magnetic sensor element 2606 within the first magnetic sensor package 2503 described above in connection with FIG. 25 and FIG. 26). FIG. 28 illustrates example effects that a target magnetic field together with a stray magnetic field may have on the outputs of magnetic sensor elements within a magnetic sensor package (for example, the first magnetic sensor element 2602, the second magnetic sensor element 2604, and the third magnetic sensor element 2606 within the first magnetic sensor package 2503 described above in connection with FIG. 25 and FIG. 26).

In some examples, a processor element may determine whether there is a stray magnetic field based on the first output, the second output, and/or the third output, similar to those described above in connection with at least FIG. 8, FIG. 15, and/or FIGS. 18-19.

It is to be understood that the disclosure is not to be limited to the specific embodiments disclosed, and that modifications and other embodiments are intended to be included within the scope of the appended claims. Although specific terms are employed herein, they are used in a generic and descriptive sense only and not for purposes of limitation, unless described otherwise.

The invention claimed is:

1. An apparatus for detecting a stray magnetic field, comprising:
    a first magnetic sensor element at a first position relative to a magnetic field source to detect a target magnetic field emitted by the magnetic field source;
    a second magnetic sensor element at a second position relative to the magnetic field source to detect the target magnetic field emitted by the magnetic field source; and
    a processor element electronically coupled to the first magnetic sensor element and the second magnetic sensor element, wherein the processor element is configured to:
    receive a first output from the first magnetic sensor element; receive a second output from the second magnetic sensor element; and
    detect the stray magnetic field interfering with the target magnetic field by:
        calculating an output deviation between the first output and the second output; and
        determining whether the output deviation satisfies a deviation criteria.

2. The apparatus of claim 1, wherein the first magnetic sensor element comprises a first anisotropic magnetoresistive sensing member, wherein the second magnetic sensor element comprises a second anisotropic magnetoresistive sensing member.

3. The apparatus of claim 1, wherein the magnetic field source comprises a magnetic element.

4. The apparatus of claim 3, wherein the magnetic element is a ring magnet comprising at least a first pole and a second pole.

5. The apparatus of claim 3, wherein the first magnetic sensor element is aligned with a first radius of the magnetic element, wherein the second magnetic sensor element is aligned with a second radius of the magnetic element, wherein the first radius is positioned forty-five degrees apart from the second radius.

6. The apparatus of claim 1, wherein the first magnetic sensor element, the second magnetic sensor element, and the processor element are contained in a same integrated circuit.

7. The apparatus of claim 6, wherein, in response to detecting the stray magnetic field, the processor element is further configured to disable position outputs associated with the apparatus.

8. The apparatus of claim 1, wherein the first magnetic sensor element and the second magnetic sensor element are integrated in a first magnetic sensor package.

9. The apparatus of claim 8, wherein, when detecting the stray magnetic field, the processor element is configured to further:
    determine a phase separation based at least in part on the first position associated with the first magnetic sensor element and the second position associated with the second magnetic sensor element;
    calculate the output deviation between the first output and the second output; and
    determine whether the output deviation satisfies a deviation criterion, wherein the deviation criterion is based at least in part on the phase separation.

10. The apparatus of claim 9, wherein the first magnetic sensor element, the second magnetic sensor element, and the processor element are contained in a same integrated circuit.

11. The apparatus of claim 10, wherein, in response to detecting the stray magnetic field, the processor element is further configured to disable position outputs associated with the apparatus.

12. The apparatus of claim 8, further comprising a third magnetic sensor element integrated in the first magnetic sensor package, wherein the processor element is configured to further receive a third output from the third magnetic sensor element, wherein detecting the stray magnetic field is further based on the third output.

13. The apparatus of claim 12, wherein the first magnetic sensor element, the second magnetic sensor element, the third magnetic sensor element, and the processor element are contained in the same integrated circuit.

14. The apparatus of claim 13, wherein, in response to detecting the stray magnetic field, the processor element is further configured to disable position outputs associated with the apparatus.

* * * * *